US007970029B2

United States Patent
Teramura

(10) Patent No.: US 7,970,029 B2
(45) Date of Patent: *Jun. 28, 2011

(54) METHOD AND APPARATUS FOR DRIVING SEMICONDUCTOR LASERS, AND METHOD AND APPARATUS FOR DERIVING DRIVE CURRENT PATTERNS FOR SEMICONDUCTOR LASERS

(75) Inventor: Yuichi Teramura, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 377 days.

This patent is subject to a terminal disclaimer.

(21) Appl. No.: 12/089,463

(22) PCT Filed: Oct. 5, 2006

(86) PCT No.: PCT/JP2006/320352
§ 371 (c)(1),
(2), (4) Date: Apr. 7, 2008

(87) PCT Pub. No.: WO2007/043597
PCT Pub. Date: Apr. 19, 2007

(65) Prior Publication Data
US 2009/0141754 A1 Jun. 4, 2009

(30) Foreign Application Priority Data
Oct. 7, 2005 (JP) .................................. 2005-294573

(51) Int. Cl.
*H01S 5/0683* (2006.01)
(52) U.S. Cl. ................................. 372/38.01; 372/29.011
(58) Field of Classification Search ............... 372/38.01, 372/29.011
See application file for complete search history.

(56) References Cited

U.S. PATENT DOCUMENTS

| | | | | |
|---|---|---|---|---|
| 5,309,458 A | * | 5/1994 | Carl | 372/34 |
| 5,966,394 A | * | 10/1999 | Spurr et al. | 372/34 |
| 7,522,509 B2 | * | 4/2009 | Miyamoto et al. | 369/116 |
| 7,724,790 B2 | * | 5/2010 | Teramura | 372/29.015 |
| 2002/0164146 A1 | * | 11/2002 | Ji et al. | 385/140 |
| 2002/0191171 A1 | | 12/2002 | Nishi | |
| 2005/0018255 A1 | | 1/2005 | Nakaya et al. | |
| 2005/0084202 A1 | * | 4/2005 | Smith et al. | 385/14 |
| 2005/0157286 A1 | | 7/2005 | Sasaki | |
| 2005/0254403 A1 | * | 11/2005 | Ishibashi et al. | 369/125 |
| 2006/0050355 A1 | * | 3/2006 | Godfried et al. | 359/260 |

(Continued)

FOREIGN PATENT DOCUMENTS

JP 7131093 A 5/1995

(Continued)

*Primary Examiner* — Minsun Harvey
*Assistant Examiner* — Marcia A. Golub-Miller
(74) *Attorney, Agent, or Firm* — Sughrue Mion, PLLC

(57) ABSTRACT

Semiconductor lasers are driven such that high output laser beams are stably obtained without a long start up time. The light outputs of a plurality of semiconductor lasers are detected by photodetectors. The semiconductor lasers are driven by automatic power control based on comparison results between the output of the photodetectors and a set value corresponding to a target light output for the semiconductor lasers. A correction pattern that corrects the set value and/or the output of the photodetectors such that the actual light output becomes uniform is generated in advance. The set value and/or the output are varied according to the correction pattern for a predetermined period of time from initiation of drive. A single correction pattern is employed in common with respect to the plurality of semiconductor lasers.

2 Claims, 20 Drawing Sheets

U.S. PATENT DOCUMENTS

2008/0259978 A1 * 10/2008 Hamagishi et al. ........ 372/29.02

FOREIGN PATENT DOCUMENTS

| | | | |
|---|---|---|---|
| JP | 8274395 A | 10/1996 | |
| JP | 200185314 A | 3/2001 | |
| JP | 2001267669 A | 9/2001 | |
| JP | 200496062 A | 3/2004 | |
| JP | 200555881 A | 3/2005 | |
| JP | 2005202226 A | 7/2005 | |

* cited by examiner

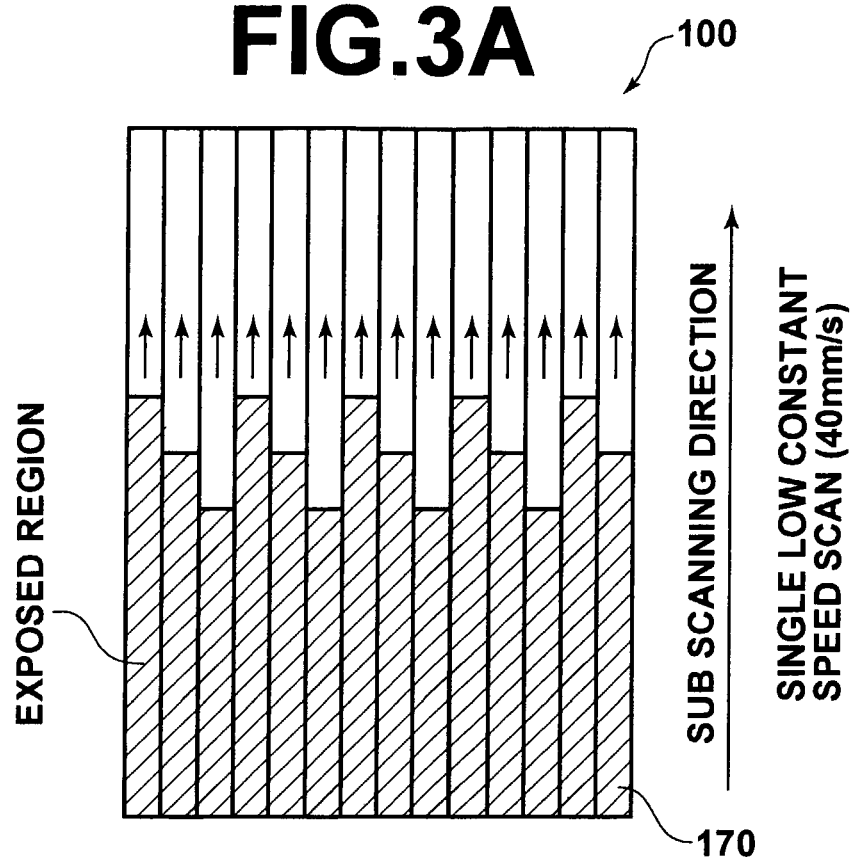
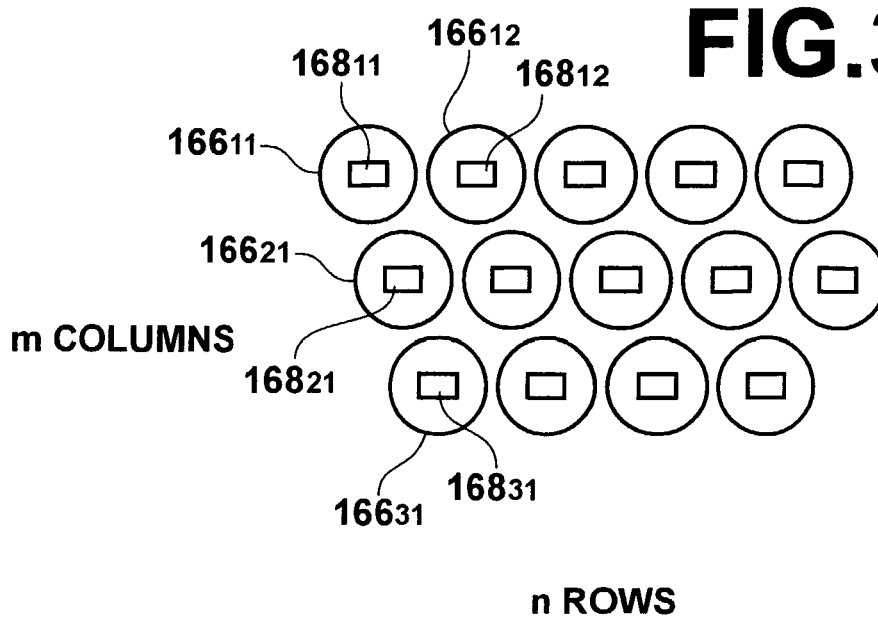

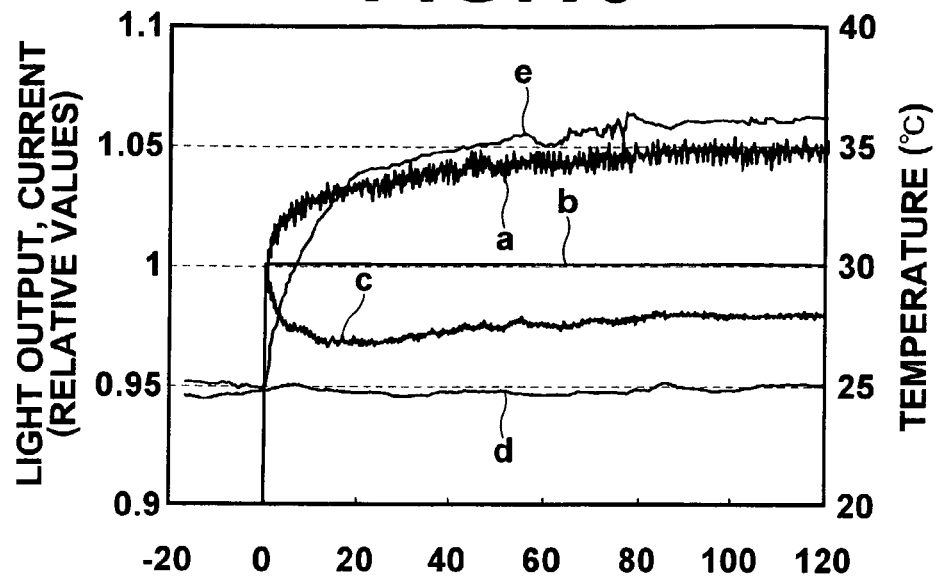
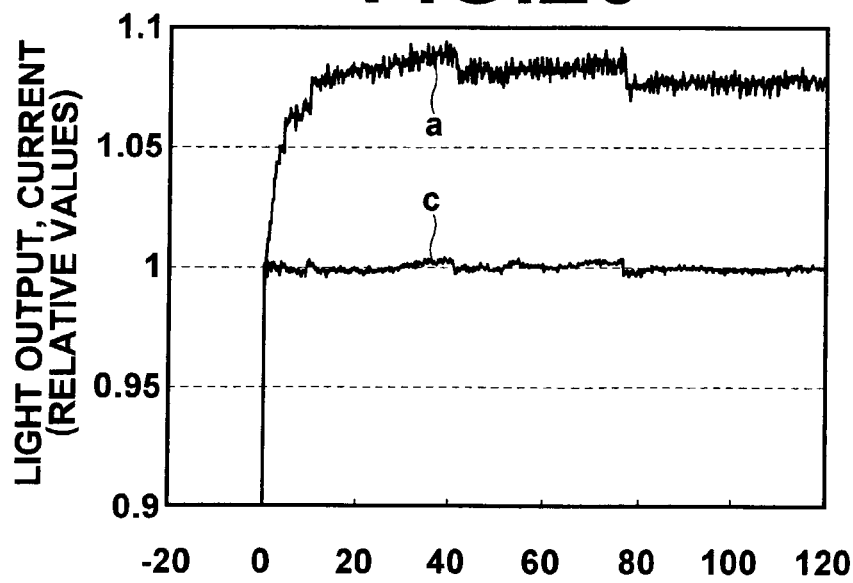

METHOD AND APPARATUS FOR DRIVING SEMICONDUCTOR LASERS, AND METHOD AND APPARATUS FOR DERIVING DRIVE CURRENT PATTERNS FOR SEMICONDUCTOR LASERS

TECHNICAL FIELD

The present invention relates to a method and apparatus for driving semiconductor lasers.

The present invention also relates to a method for generating a correction pattern, which is utilized in the method for driving semiconductor lasers, for correcting a set value used in automatic power control and/or the outputs of photodetectors.

Further, the present invention relates to an exposure apparatus for exposing photosensitive materials with light, which is emitted from semiconductor lasers and modulated by spatial light modulating elements.

BACKGROUND ART

Semiconductor lasers are in practical use in many fields. Japanese Unexamined Patent Publication No. 2005-055881 discloses a laser exposure apparatus that modulates light emitted from semiconductor lasers with spatial light modulating elements, and exposes photosensitive materials with the modulated light.

In addition, GaN type semiconductor lasers that emit laser beams having wavelengths in the vicinity of 400 nm are known, as disclosed, for example, in Japanese Unexamined Patent Publication No. 2004-096062. Japanese Unexamined Patent Publication No. 2005-055881 discloses that the exposure apparatus employs this type of semiconductor laser as an exposure light source.

In applications of semiconductor lasers, such as when they are employed in the aforementioned exposure apparatus, it is desired to drive the semiconductor lasers such that their light output is constant. Known methods for driving semiconductor lasers in this manner include an ACC (Automatic Current Control) drive method, and an APC (Automatic Power Control) drive method, as disclosed in Japanese Unexamined Patent Publication No. 8 (1996)-274395. Note that Japanese Unexamined Patent Publication No. 2001-267669 discloses a driving method for semiconductor lasers, in which the semiconductor lasers are driven by the ACC method immediately following initiation of drive of the semiconductor lasers such that the drive current value is gradually increased, then driven by the APC method thereafter.

The drive current/light output properties of semiconductor lasers change due to self heating and the like. Therefore, it is recognized that the ACC drive method, in which drive current is controlled to be constant, has a drawback that the light output changes after the laser is turned on. This defect occurs particularly conspicuously in high output semiconductor lasers. Similarly, this defect occurs conspicuously in laser apparatuses, in which pluralities of semiconductor lasers are mounted. Further, blue-violet GaN type semiconductor lasers have poorer luminous efficiency and generate a greater amount of heat than red lasers. Therefore, the light output changes more conspicuously in blue-violet GaN type semiconductor lasers.

In view of these circumstances, the APC drive method is generally employed to obtain stable light output. In the APC drive method, the drive current is controlled by: causing a portion of a laser beam emitted by a semiconductor laser to enter a monitoring photodetector; and creating a feedback loop such that a monitor current, which is generated proportionate to the light output of the semiconductor laser, becomes constant.

In the APC drive method, however, a portion of the emitted light is utilized as an input to the feedback loop, causing a drawback that the amount of light to be utilized for the intended purpose is reduced. In addition, additional costs become necessary to provide a light amount feedback loop circuit.

Further, in the APC method, there is a problem that light output will not stabilize under specific conditions. That is, semiconductor lasers are generally constituted by semiconductor laser chips housed within a Can type package. Monitoring photodetectors for detecting light emitted toward the rear of the semiconductor chips are also housed within the package. The APC method is normally realized by employing the monitoring photodetectors, to obtain stabilized light output. However, there are cases in which light output does not stabilize even if the APC drive method is adopted, particularly when the semiconductor lasers are high output lasers, such as GaN type semiconductor lasers.

This is because the quantum efficiency of the photodetectors such as photodiodes, which are placed in the vicinity of the semiconductor laser chips, change due to the heat generated by the semiconductor laser chips. Accordingly, the light input amount/output properties of the photodetectors change. In this case, it is difficult to stabilize light output even if the drive method that employs both the ACC drive method and the APC drive method disclosed in Japanese Unexamined Patent Publication No. 2001-267669 is employed.

Meanwhile, in laser exposure apparatuses such as that described above, the light output of the semiconductor lasers is a factor that determines the takt time of exposure processes. Therefore, obtainment of stable high output laser beams at low cost is desired. However, in the case that the ACC drive method is employed to obtain stable light output, the laser exposure apparatuses must stand by until the temperature of the semiconductor lasers stabilizes after they are turned ON. This generates loss in production time, thereby increasing the takt time of the laser exposure apparatuses. The increase in the takt time deteriorates the productivity of exposure processes.

Constantly keeping the semiconductor lasers in an ON state may be considered as a method to eliminate the time loss caused by the aforementioned standby state. However, the life of lasers is determined by the amount of time that they emit light. Therefore, the effective life of the semiconductor lasers is reduced by the amount of time that they are in the ON state and are not being utilized to perform exposure processes. In the case that the percentage of time that the lasers are utilized for exposure within the total time that the lasers in the ON state is 50%, for example, the life of the semiconductor lasers is reduced by approximately ½.

The present invention has been developed in view of the foregoing circumstances. It is an object of the present invention to provide a method and apparatus for driving semiconductor lasers which enables obtainment of stable high output laser beams simply, at low cost, and without a long startup time.

It is another object of the present invention to provide a method and apparatus for deriving correction patterns, which are employed in the method and apparatus for driving semiconductor lasers, for correcting the set value for automatic power control and/or the output of photodetectors.

It is still another object of the present invention to shorten the takt time of exposure apparatuses that expose photosensitive materials with light, which is emitted from semiconductor lasers and modulated by spatial light modulating elements.

DISCLOSURE OF THE INVENTION

The method for driving semiconductor lasers according to the present invention is a method for driving at least one semiconductor, comprising the steps of:

detecting the output of the at least one semiconductor laser with at least one photodetector;

comparing the output current of the at least one photodetector against a set value corresponding to a target light output of the at least one semiconductor laser; and controlling the drive current of the at least one semiconductor laser based on the comparison results, wherein:

a correction pattern, which is defined according to the amount of time which has passed since initiating driving thereof, that enables obtainment of a substantially uniform light output is generated in advance; and the set value and/or the output current of the at least one photodetector is varied according to the correction pattern for a predetermined period of time from initiation of drive of the at least one semiconductor laser.

Note that in the present specification, "output current" of photodetectors refers to output photo-current or voltage.

Note that in the method for driving at least one semiconductor laser according to the present invention, a single correction pattern may be utilized in common to drive a plurality of semiconductor lasers.

In the case that a single correction pattern is utilized in common to drive a plurality of semiconductor lasers, it is desirable for the varying of the set value and/or the output current of the at least one photodetector according to the correction pattern to be performed with a common timing for the plurality of semiconductor lasers.

Further, in the case that a single correction pattern in utilized in common to drive a plurality of semiconductor lasers, and in the case that laser beams emitted from the plurality of semiconductor lasers are multiplexed, it is desirable for the varying of the set value and/or the output current of the at least one photodetector according to the correction pattern to be performed with time lags among the plurality of semiconductor lasers.

It is preferable for the method for driving semiconductor lasers according to the present invention to be applied to drive a plurality of semiconductor lasers which are fixed on a common heat sink.

It is preferable for the method for driving semiconductor lasers according to the present invention to be applied to drive a plurality of semiconductor lasers of an apparatus comprising the plurality of semiconductor lasers; and a multiplexing optical fiber, into which laser beams emitted by each of the plurality of semiconductor lasers enter to be multiplexed thereby.

Further, it is desirable for the method for driving semiconductor lasers according to the present invention to be applied to drive GaN type semiconductor lasers.

It is desirable for the method for driving semiconductor lasers according to the present invention to be applied to cases in which the at least one photodetector for use in the APC drive method is provided within a package, in which the at least semiconductor laser is also provided.

The apparatus for driving semiconductor lasers according to the present invention is an apparatus for driving at least one semiconductor laser by:

detecting the output of the at least one semiconductor laser with at least one photodetector;

comparing the output current of the at least one photodetector against a set value corresponding to a target light output of the at least one semiconductor laser; and controlling the drive current of the at least one semiconductor laser based on the comparison results, comprising:

memory means, in which a correction pattern, which is defined according to the amount of time which has passed since initiating driving thereof, that enables obtainment of a substantially uniform light output is recorded; and control means, for varying the set value and/or the output current of the at least one photodetector according to the correction pattern for a predetermined period of time from initiation of drive of the semiconductor laser.

Note that it is preferable for the control means to utilize a single correction pattern in common to drive a plurality of semiconductor lasers.

In the case that the control means is configured to utilize a single correction pattern in common to drive a plurality of semiconductor lasers, it is desirable for the control means to vary the set value and/or the output current of the at least one photodetector according to the correction pattern with a common timing for the plurality of semiconductor lasers.

In the case that the control means is configured to utilize a single correction pattern in common to drive a plurality of semiconductor lasers, and laser beams emitted from the plurality of semiconductor lasers are multiplexed, it is desirable for the control means to vary the set value and/or the output current of the at least one photodetector according to the correction pattern, with time lags among the plurality of semiconductor lasers.

It is particularly desirable for the apparatus for driving semiconductor lasers according to the present invention to be configured to drive a plurality of semiconductor lasers which are fixed on a common heat sink.

It is particularly preferable for the apparatus for driving semiconductors according to the present invention to be applied to drive a plurality of semiconductor lasers of an apparatus comprising the plurality of semiconductor lasers; and a multiplexing optical fiber, into which laser beams emitted by each of the plurality of semiconductor lasers enter to be multiplexed thereby.

It is particularly desirable for the apparatus for driving semiconductor lasers according to the present invention to be applied to drive GaN type semiconductor lasers.

It is desirable for the apparatus for driving semiconductor lasers according to the present invention to be applied to cases in which the at least one photodetector for use in the APC drive method is provided within a package, in which the at least semiconductor laser is also provided.

A first method for deriving a correction pattern, which is employed in the method for driving at least one semiconductor laser according to the present invention, comprises the steps of:

driving the at least one semiconductor laser under automatic power control, by controlling the drive current thereof based on the comparison results between output current of the at least one photodetector and the set value corresponding to the target light output for the at least one semiconductor laser at a comparatively high speed;

detecting the light output of the at least one semiconductor laser with at least one other photodetector, which is provided at a position which is substantially not influenced by heat generated by the at least one semiconductor laser;

varying the set value and/or the output of the at least one other photodetector at a comparatively low speed to perform automatic power control such that the output of the at least one semiconductor laser detected by the at least one other photodetector becomes uniform; and designating the pattern of variation of the set value and/or the output of the at least one other photodetector as the correction pattern.

A second method for deriving a correction pattern, which is employed in the method for driving at least one semiconductor laser according to the present invention, comprises the steps of:

driving the at least one semiconductor laser under automatic power control, by controlling the drive current thereof based on the comparison results between output current of the at least one photodetector and the set value corresponding to the target light output for the at least one semiconductor laser;

detecting at least a portion of the light output of the at least one semiconductor laser with at least one other photodetector, which is provided at a position which is substantially not influenced by heat generated by the at least one semiconductor laser;

calculating amounts of correction for the set value and/or the output of the at least one other photodetector at set increments of time passed, from variation properties of the output of the at least one other photodetector at the set increments of time passed; and designating the relationship between the amounts of correction and the passage of time as the correction pattern.

In the methods for deriving a correction pattern according to the present invention, it is particularly desirable for the at least one photodetector employed to perform the automatic power control to be provided in the same package as the at least one semiconductor laser.

An apparatus for deriving a correction pattern, which is employed by an apparatus for driving at least one semiconductor laser according to the present invention, comprises:

at least one photodetector for detecting the light output of the at least one semiconductor laser;

an automatic power control circuit, for driving the at least one semiconductor laser under automatic power control, by controlling the drive current thereof based on the comparison results between output current of the at least one photodetector and the set value corresponding to the target light output for the at least one semiconductor laser at a comparatively high speed;

at least one other photodetector, which is provided at a position which is substantially not influenced by heat generated by the at least one semiconductor laser, for detecting the light output of the at least one semiconductor laser; and means for varying the set value and/or the output of the at least one other photodetector at a comparatively low speed to perform automatic power control such that the output of the at least one semiconductor laser detected by the at least one other photodetector becomes uniform, and for designating the pattern of variation of the set value and/or the output of the at least one other photodetector as the correction pattern.

Note that it is desirable for the apparatus for deriving correction patterns according to the present invention to be applied to cases in which the at least one photodetector for use in the APC drive method is provided within a package, in which the at least semiconductor laser is also provided.

Meanwhile, the exposure apparatus according to the present invention is an exposure apparatus for exposing a photosensitive material with modulated light, comprising:

at least one semiconductor laser;

at least one spatial light modulating element, for modulating light emitted by the at least one semiconductor laser; and an apparatus for driving at least one semiconductor laser according to the present invention.

FIG. 19 is a graph that illustrates an example of the changes in (a) drive current; (b) amount of current output by a photodiode for use in the APC drive method, which represents the light output of a semiconductor laser provided within a Can type package; (c) light output of a semiconductor laser detected by an optical power meter; (d) temperature of a temperature controlled substrate on which a semiconductor laser is mounted; and (e) temperature in the vicinity of the semiconductor laser, when a GaN type semiconductor laser is driven for 150 seconds by the APC drive method. Note that the values of (a), (b), and (c) are denoted by relative values along the vertical axis at the left side of the graph, and the values of (d) and (e) are denoted by actual measured values (° C.) along the vertical axis at the right side of the graph The light output (c) of the semiconductor laser is measured by a power meter, which is provided at a position where heat generated by the semiconductor laser has no substantial effect.

As illustrated in the graph of FIG. 19, the amount of light received (b) by the photodiode within the Can type package for use in the APC driving method is constant, when the semiconductor laser is driven by the APC driving method. However, the actual light output (c), as detected at a position remote from the package, decreases greatly immediately following drive initiation, then gradually increases over time before stabilizing. This is caused by the aforementioned change in quantum efficiency of the photodiodes, which are placed in the vicinity of the semiconductor laser chips, due to the heat generated by the semiconductor laser chips and the corresponding changes in the light input amount/output properties thereof.

As described above, the amount of light received (b) differs from the actual light output (c). However, a predetermined relationship exists between the two. Therefore, if the output of the photodetector employed for APC driving is corrected based on this relationship, it would be possible for the actual light output to be substantially stabilized. Specifically, the actual light output (c) gradually decreases following initiation of drive. Therefore, the amount of light received (b), the actual measured value of which is flat, may be corrected such that it is decreased following initiation of drive. In this case, the drive current (a) will increase, and as a result, the actual light output (c) will become substantially uniform.

In the APC driving method, in which the drive current of a semiconductor laser is controlled based on comparison results between output from photodetectors and a set value corresponding to a target light output of the semiconductor laser, the set value can be corrected instead of the output of the photodetectors, to cause actual light output to become substantially uniform. That is, in the case that it is necessary to decrease the amount of light received (b) as in the case described above, the set value may be corrected to increase. Thereby, the drive current (a) will increase, and equivalent results can be obtained. Further, both of the set value and the output of the photodetectors may be corrected to obtain equivalent results.

The method for driving semiconductor lasers according to the present invention comprises the steps of: generating a correction pattern for correcting the set value and/or the output current of the at least one photodetector such that the actual light output becomes uniform, defined according to the amount of time which has passed since initiating driving of the at least one semiconductor laser; and varying the set value and/or the output current of the at least one photodetector according to the correction pattern for a predetermined period of time from initiation of drive of the at least one semiconductor laser. Therefore, the light output of the semiconductor laser changes in a manner as illustrated in FIG. 20, for example, and constant target light output is approached in a shorter amount of time.

Thereby, high output laser beams can be stably obtained without a long start up time. In addition, the structure for driving semiconductor lasers in this manner utilizes the internal photodetector of a semiconductor laser, and can be produced by slightly modifying a configuration for realizing the APC driving method, which is generally provided in semiconductor laser apparatuses. Accordingly, a configuration that realizes the method can be produced simply and at low cost.

A single correction pattern for varying the set value and/or the output current of the at least one photodetector may be employed in common to drive a plurality of semiconductor lasers. In this case, a small capacity memory means may be employed to record the correction pattern therein.

In the method for driving semiconductor lasers according to the present invention, the step of varying the set value and/or the output current of the at least one photodetector according to the correction pattern may be performed with a common timing for the plurality of semiconductor lasers. In this case, only a single current control means would be necessary, which enables manufacture of a driving apparatus at low cost.

In the method for driving semiconductor lasers according to the present invention, in the case that a single correction pattern is utilized in common to drive a plurality of semiconductor lasers, and laser beams emitted from the plurality of semiconductor lasers are multiplexed the step of varying the drive current of the semiconductor lasers according to the pattern may be performed with time lags among the plurality of semiconductor lasers. In this case, slight variations in light output among each of the semiconductor lasers prior to multiplexing are canceled, and variations in light output of a multiplexed laser beam can be smoothed.

The method for driving semiconductor lasers according to the present invention may be applied to drive a plurality of semiconductor lasers which are fixed on a common heat sink. In this case, the method is particularly effective in stabilizing light output. That is, in a configuration such as that described above, the properties of each of the semiconductor lasers may change due to synergistic heat generated thereby. Even in this case, if a single common pattern is employed to drive the plurality of semiconductor lasers, fluctuations in light output due to the synergistic heat generated thereby can be corrected.

The method for driving semiconductor lasers according to the present invention may be applied to drive a plurality of semiconductor lasers of an apparatus comprising: the plurality of semiconductor lasers; and a multiplexing optical fiber, into which laser beams emitted by each of the plurality of semiconductor lasers enter to be multiplexed thereby. In this case, the stabilization effect of light output is particularly conspicuous.

That is, in the above structure, there are cases in which output of the multiplexed laser beam fluctuate, not only due to differences in the drive current/light output properties of the plurality of semiconductor lasers that are driven, but also due to the heat generated thereby. The fluctuations are caused by thermal expansion of structural members of the apparatus due to the generated heat. The thermal expansion shifts the laser beams and the optical fibers from their coaxial states, thereby changing the input efficiencies of the laser beams with respect to the optical fibers. Further, there are cases in which the beam profiles of the laser beams fluctuate during the period from drive initiation to a steady driving state. The input efficiencies of the laser beams with respect to the optical fibers may change in these cases as well.

However, if the pattern for driving the semiconductor lasers is generated by detecting the laser beam emitted from the optical fiber, a pattern that reflects the changes in input efficiencies can be obtained. Therefore, fluctuations in light output caused by the changes in input efficiencies can also be corrected.

Further, the method for driving semiconductor lasers according to the present invention is particularly effective in stabilizing light output when the semiconductor lasers to be driven are GaN type semiconductor lasers. GaN type semiconductor lasers generate more heat in comparison with other types of semiconductor lasers, such as GaAs type semiconductor lasers. Therefore, the drive current/light output properties thereof fluctuate conspicuously during a period of time from drive initiation to a steady driving state. However, by applying the method for driving semiconductor lasers according to the present invention, the fluctuations in the drive current/light output properties of GaN type semiconductor lasers can be corrected, thereby enabling stabilization of light output thereby.

In addition, GaN type semiconductor lasers have the characteristic that only the oscillation threshold current thereof changes in response to temperature changes, at or near room temperature. That is, the slope efficiency thereof does not change greatly in response to temperature changes at or near room temperature. Therefore, in the case that the semiconductor lasers to be driven are GaN type semiconductor lasers, parameters, which are determined for an arbitrary current range, can be utilized within substantially all output ranges. That is, the parameters do not need to be changed according to changes in output.

Meanwhile, the apparatus for driving semiconductor lasers according to the present invention is capable of executing the method of driving semiconductor lasers according to the present invention described above.

The method for deriving correction patterns according to the present invention can efficiently generate correction patterns to be utilized in the method for driving semiconductor lasers according to the present invention.

As described in detail above, the method for driving semiconductor lasers according to the present invention enables obtainment of stable high output laser beams simply, at low cost, and without a long startup time. Accordingly, the exposure apparatus according to the present invention, which employs the driving apparatus that executes this method, has a short standby time until the output of laser beams stabilizes, which shortens the takt time of image exposure. Therefore, the semiconductor lasers, which are the exposure light sources of the exposure apparatus, can be replaced less frequently, thereby reducing the running costs of the exposure apparatus as well.

BRIEF DESCRIPTION OF THE DRAWINGS

FIG. 3A is a plan view that illustrates exposed regions, which are formed on a photosensitive material.

FIG. 3B is a diagram that illustrates the arrangement of exposure areas exposed by exposure heads.

FIG. 19 is a graph that illustrates light output fluctuation properties and temperature fluctuation properties of a semiconductor laser driven by a conventional APC driving method.

FIG. 20 is a graph that illustrates light output fluctuation properties of a semiconductor laser driven by the method according to the present invention.

BEST MODE FOR CARRYING OUT THE INVENTION

Hereinafter, preferred embodiments according to the present invention will be described in detail with reference to the attached drawings. First, an image exposure apparatus according to a first embodiment according to the present invention will be described.

[Configuration of the Image Exposure Apparatus]

Figure 1:
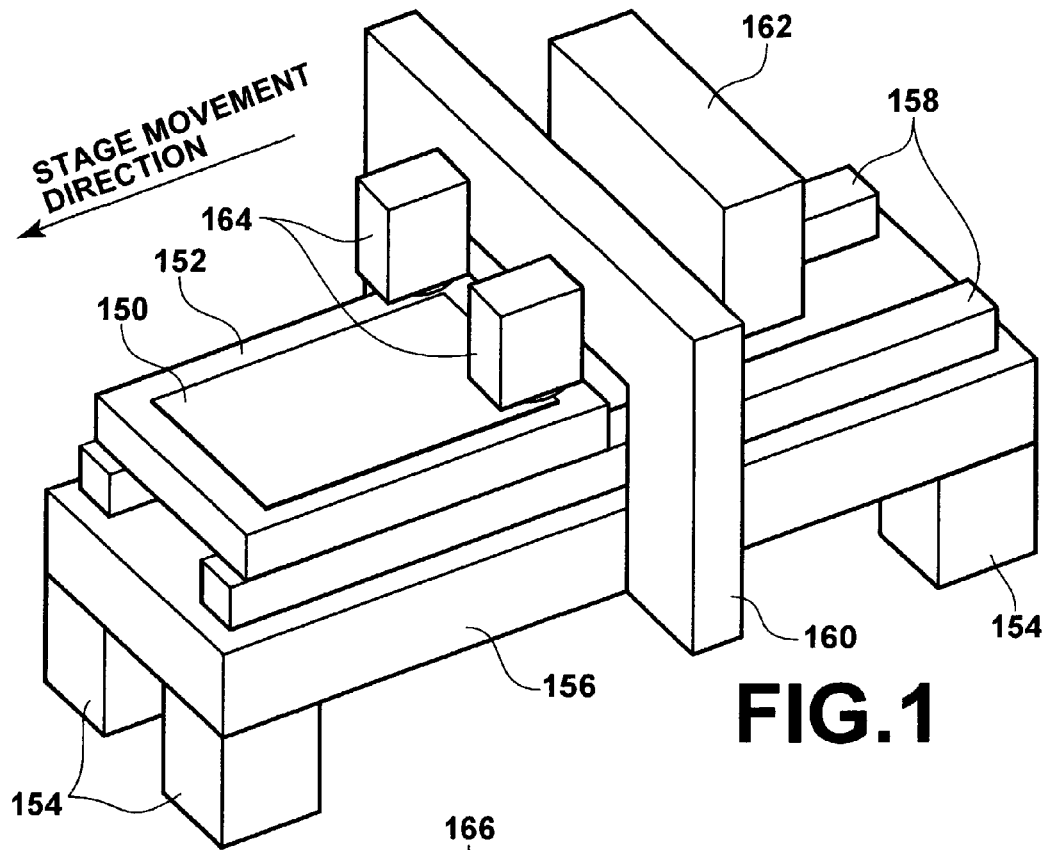
FIG. 1 is a perspective view that illustrates the outer appearance of an image exposure apparatus according to a first embodiment according to the present invention.

As illustrated in FIG. 1, the image exposure apparatus is equipped with a planar moving stage 152, for holding sheets of photosensitive material 150 thereon by suction. Amounting base 156 is supported by four legs 154. Two guides 158 that extend along the stage movement direction are provided on the upper surface of the mounting base 156. The stage 152 is provided such that its longitudinal direction is aligned with the stage movement direction, and supported by the guides 158 so as to be movable reciprocally thereon. Note that the image exposure apparatus is also equipped with a stage driving apparatus 304 (refer to FIG. 15), as a sub scanning means for driving the stage 152 along the guides 158.

A C-shaped gate 160 is provided at the central portion of the mounting base so as to straddle the movement path of the stage 152. The ends of the C-shaped gate 160 are fixed to side edges of the mounting base 156. A scanner 162 is provided on a first side of the gate 160, and a plurality (two, for example) of sensors 164 for detecting the leading and trailing ends of the photosensitive material 150 are provided on a second side of the gate 160. The scanner 162 and the sensors 164 are individually mounted on the gate 160, and fixed above the movement path of the stage 152. Note that the scanner 162 and the sensors 164 are connected to a controller (not shown) for controlling the operations thereof.

Figure 2:
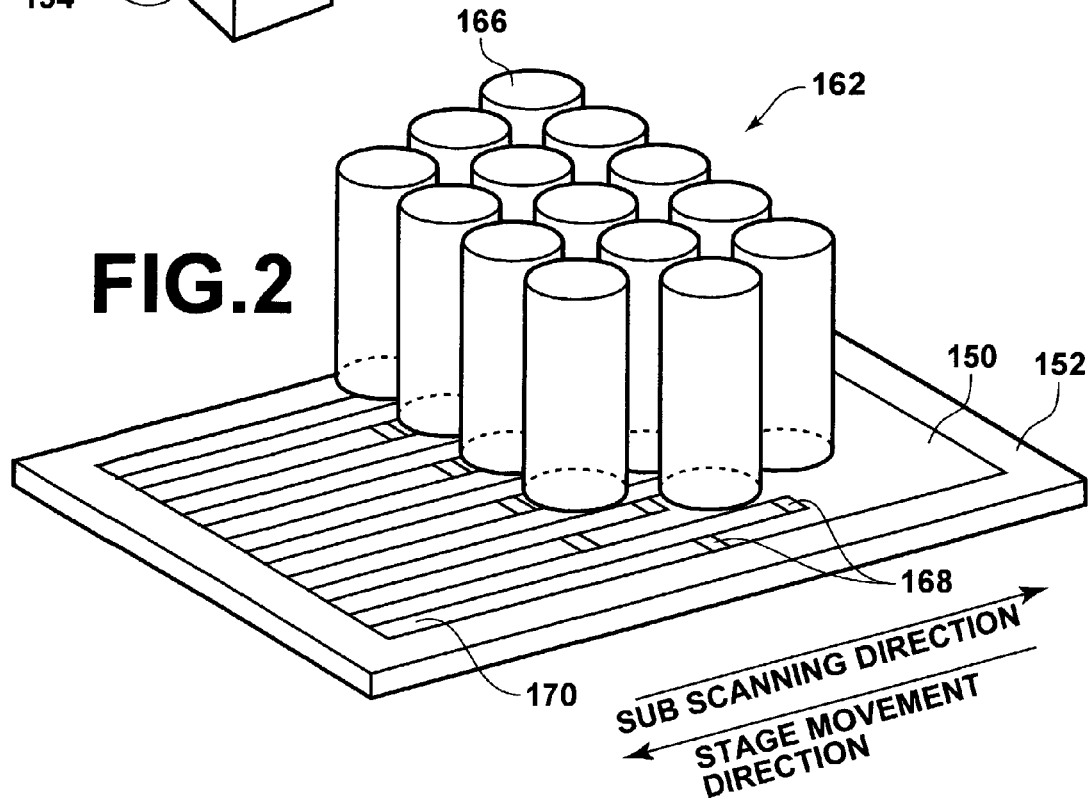
FIG. 2 is a perspective view that illustrates the construction of a scanner of the image exposure apparatus according to the first embodiment according to the present invention.

The scanner 162 is equipped with a plurality (14, for example) of exposure heads 166, arranged in an approximate matrix having m rows and n columns (3 rows and 5 columns, for example), as illustrated in FIG. 2 and FIG. 3B. In this example, four exposure heads 166 are provided in the third row, due to constraints imposed by the width of the photosensitive material 150. Note that an individual exposure head arranged in an $m^{th}$ row and an $n^{th}$ column will be denoted as an exposure head $166_{m,n}$.

An exposure area 168, which is exposed by the exposure heads 166, is a rectangular area having its short sides in the sub-scanning direction. Accordingly, band-like exposed regions 170 are formed on the photosensitive material 150 by each of the exposure heads 166, accompanying the movement of the stage 152. Note that an individual exposure area, exposed by an exposure head arranged in an $m^{th}$ row and an $n^{th}$ column will be denoted as an exposure area $168_{m,n}$.

As illustrated in FIG. 3B, each of the rows of the exposure heads 166 is provided staggered a predetermined interval (a natural number multiple of the long side of the exposure area, 2 times in the present embodiment) with respect to the other rows. This is to ensure that the band-like exposed regions 170 have no gaps therebetween in the direction perpendicular to the sub scanning direction, as illustrated in FIG. 3A. Therefore, the portion between an exposure area $168_{1,1}$ and $168_{1,2}$ of the first row, which cannot be exposed thereby, can be exposed by an exposure area $168_{2,1}$ of the second row and an exposure area $168_{3,1}$ of the third row.

Each of the exposure heads $166_{1,1}$ through $168_{m,n}$ are equipped with a DMD 50 (Digital Micro mirror Device) by Texas Instruments (U.S.), for modulating light beams incident thereon according to each pixel of image data. The DMD's 50 are connected to a controller 302 to be described later (refer to FIG. 15), comprising a data processing section and a mirror drive control section. The data processing section of the controller 302 generates control signals for controlling the drive of each micro mirror of the DMD 50 within a region that should be controlled for each exposure head 166, based on input image data. Note that the "region that should be controlled" will be described later. The mirror drive control section controls the angle of a reflective surface of each micro mirror of the DMD 50 for each exposure head 166, according to the control signals generated by the data processing section. Note that control of the angle of the reflective surface will be described later.

Figure 4:
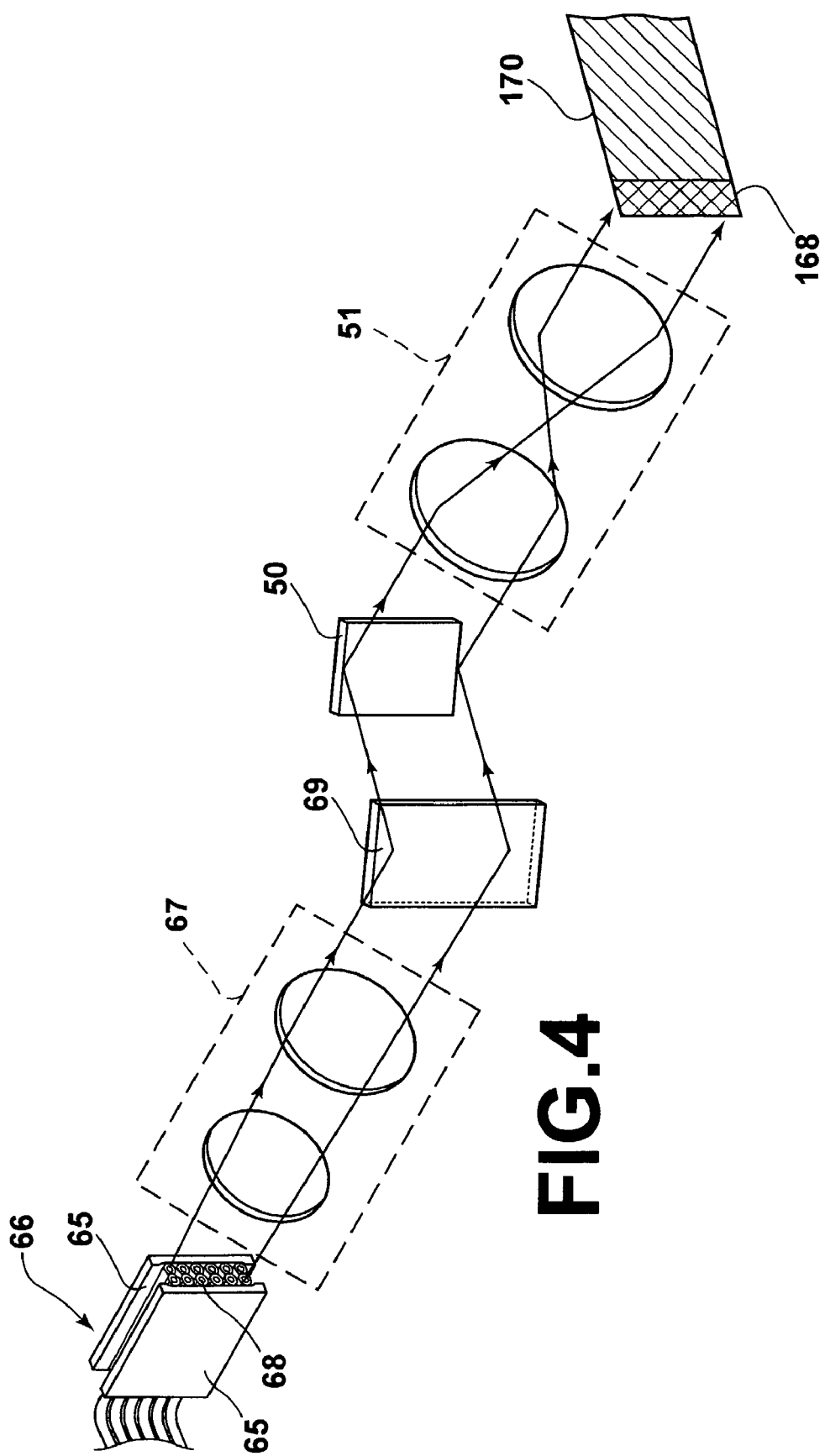
FIG. 4 is a perspective view that illustrates the schematic construction of an exposure head of the image exposure apparatus according to the first embodiment according to the present invention.

A fiber array light source 66; an optical system 67; and a mirror 69 are provided in this order, at the light incident side of the DMD 50. The fiber array light source 66 comprises a laser emitting section, constituted by a plurality of optical fibers having their light emitting ends (light emitting points) aligned in a direction corresponding to the longitudinal direction of the exposure area 168. The optical system 67 corrects laser beams emitted from the fiber array light source 66 to condense them onto the DMD 50. The mirror 69 reflects the laser beams, which have passed through the optical system 67, toward the DMD 50. Note that the optical system 67 is schematically illustrated in FIG. 4.

As illustrated in detail in FIG. 5, the optical system 67 comprises: a condensing lens 71, for condensing the laser beams B emitted from the fiber array light source 66 as illuminating light; a rod-like optical integrator 72 (hereinafter, referred to simply as "rod integrator 72"), which is inserted into the optical path of the light which has passed through the condensing lens 71; and a collimating lens 74, provided downstream from the rod integrator 72, that is, toward the side of the mirror 69. The condensing lens 71, the rod integrator 72 and the collimating lens 74 cause the laser beams emitted from the fiber array light source to enter the DMD 50 as a light beam which is close to collimated light and which has uniform beam intensity across its cross section. The shape and the operation of the rod integrator 72 will be described in detail later.

The laser beam B emitted through the optical system 67 is reflected by the mirror 69, and is irradiated onto the DMD 50 via a TIR (Total Internal Reflection) prism 70. Note that the TIR prism 70 is omitted from FIG. 4.

A focusing optical system 51, for focusing the laser beam B reflected by the DMD 50 onto the photosensitive material 150, is provided on the light reflecting side of the DMD 50. The focusing optical system 51 is schematically illustrated in FIG. 4, but as illustrated in detail in FIG. 5, the focusing optical system 51 comprises: a first focusing optical system constituted by lens systems 52 and 54; a second focusing optical system constituted by lens systems 57 and 58; a micro lens array 55; and an aperture array 59. The micro lens array 55 and the aperture array 59 are provided between the first focusing optical system and the second focusing optical system.

The DMD 50 is a mirror device having a great number (1024×768, for example) of micro mirrors 62, each of which constitutes a pixel, arranged in a matrix on an SRAM cell 60 (memory cell). A micro mirror 62 supported by a support column is provided at the uppermost part of each pixel, and a material having high reflectivity, such as aluminum, is deposited on the surface of the micro mirror 62 by vapor deposition.

Note that the reflectivity of the micro mirrors 62 is 90% or greater, and that the arrangement pitch of the micro mirrors 62 is 13.7 µm in both the vertical and horizontal directions. In addition, the CMOS SRAM cell 60 of a silicon gate, which is manufactured in a normal semiconductor memory manufacturing line, is provided beneath the micro mirrors 62, via the support column, which includes a hinge and a yoke. The DMD 50 is of a monolithic structure.

When digital signals are written into the SRAM cell 60 of the DMD 50, the micro mirrors 62 which are supported by the support columns are tilted within a range of ±α degrees (±12 degrees, for example) with respect to the substrate on which the DMD 50 is provided, with the diagonal line as the center of rotation. FIG. 7A illustrates a state in which a micro mirror 62 is tilted +α degrees in an ON state, and FIG. 7B illustrates a state in which a micro mirror 62 is tilted −α degrees in an OFF state. Accordingly, laser light beams incident on the DMD 50 are reflected toward the direction of inclination of each micro mirror 62, by controlling the tilt of each micro mirror 62 that corresponds to a pixel of the DMD 50 according to image signals, as illustrated in FIG. 6.

Figure 6:
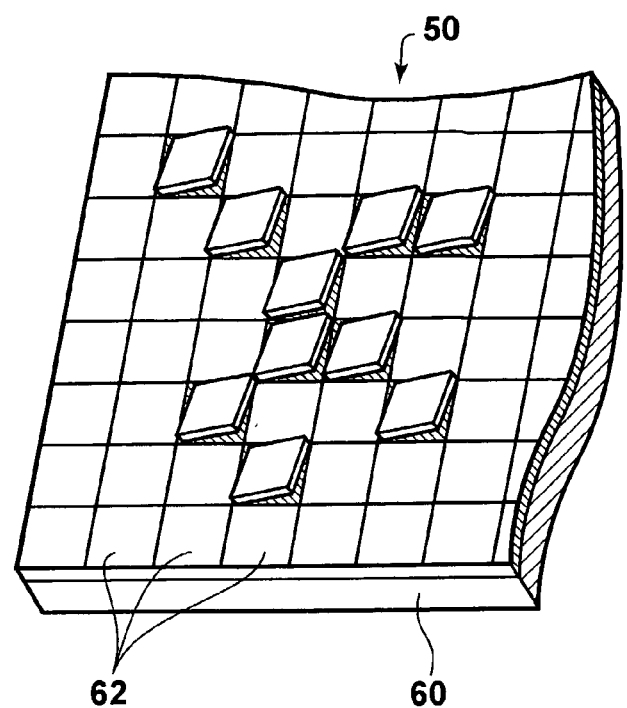
FIG. 6 is a partial magnified diagram that illustrates the construction of a digital micro mirror device (DMD).
Figure 7A:
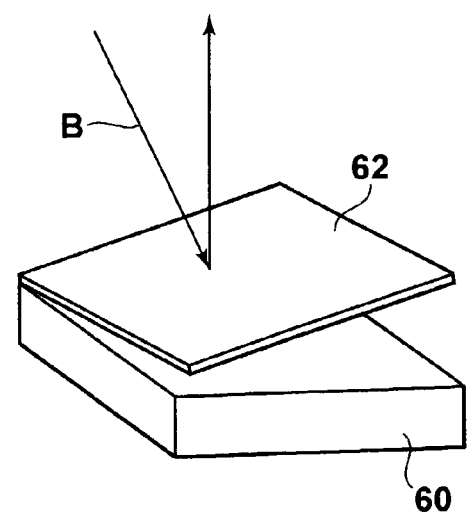
FIG. 7A is a diagram for explaining the operation of the DMD.
Figure 7B:
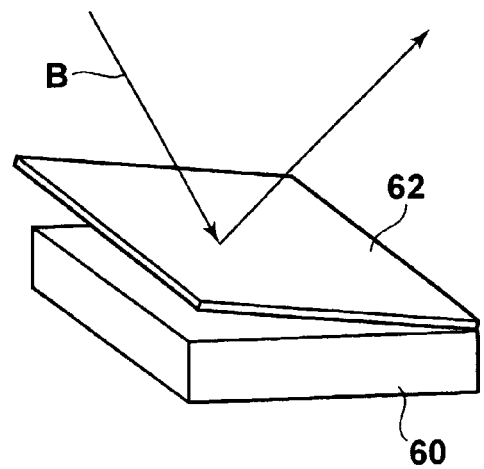
FIG. 7B is a diagram for explaining the operation of the DMD.

Note that FIG. 6 illustrates a magnified portion of a DMD 50 in which the micro mirrors 62 are controlled to be tilted at +α degrees and at −α degrees. The ON/OFF operation of each micro mirror 62 is performed by the controller 302, which is connected to the DMD 50. In addition, a light absorbing material (not shown) is provided in the direction toward which laser beams B reflected by micro mirrors 62 in the OFF state are reflected.

Figure 8A:
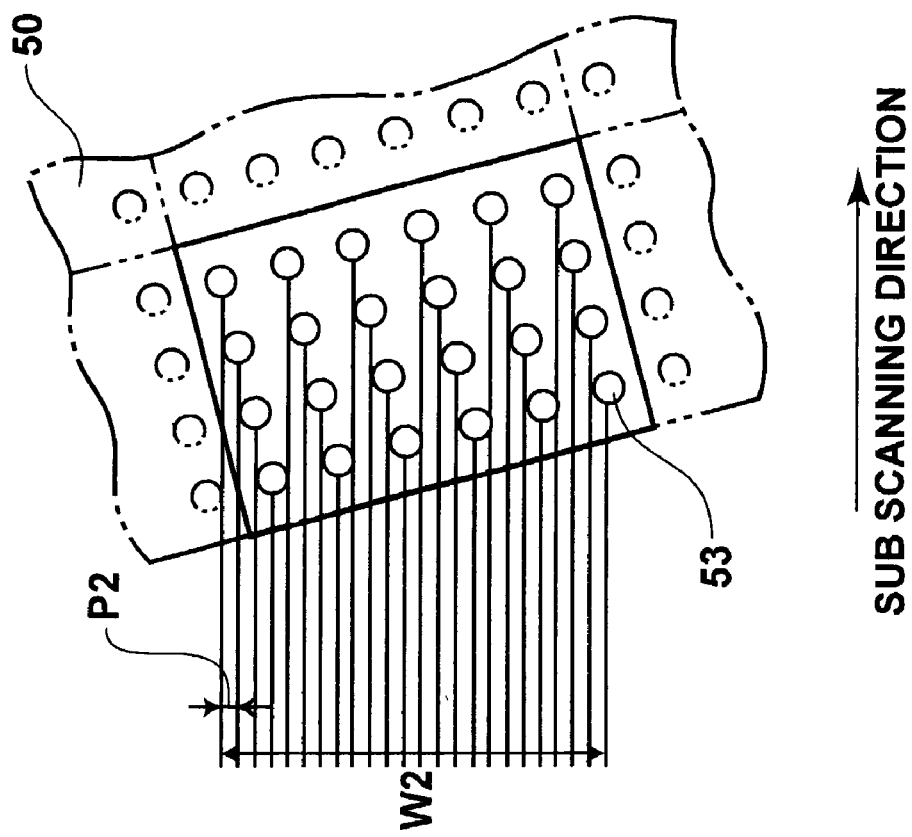
FIG. 8A is a plan view that illustrates the scanning trajectories of exposing beams in the case that the DMD is not inclined.
Figure 8B:
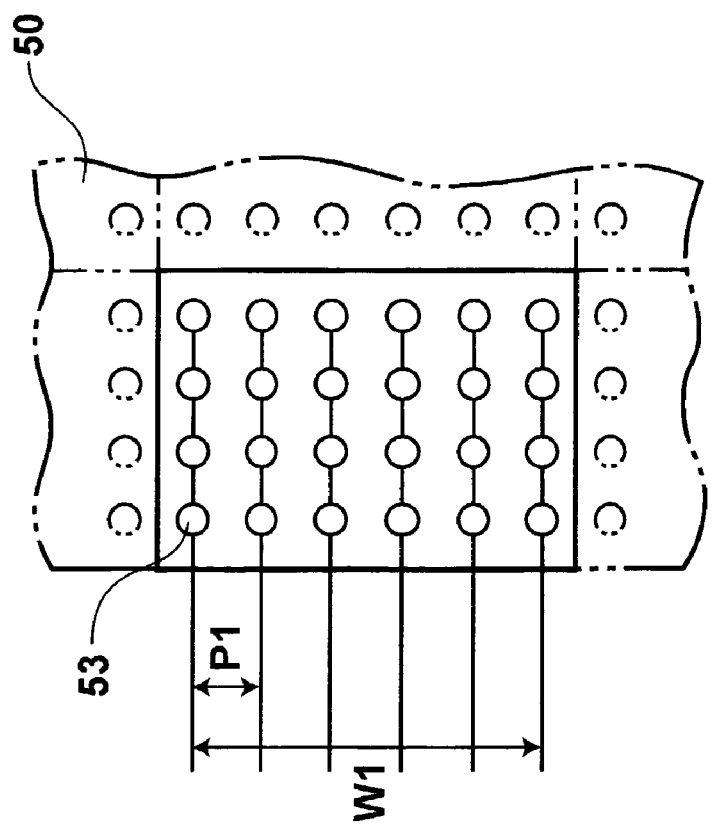
FIG. 8B is a plan view that illustrates the scanning trajectories of the exposing beams in the case that the DMD is inclined.

It is preferable for the DMD 50 to be provided such that its short side is inclined at a slight predetermined angle (0.1 to 5°, for example) with respect to the sub-scanning direction. FIG. 8A illustrates scanning trajectories of reflected light images 53 (exposing beams) of each micro mirror in the case that the DMD 50 is not inclined, and FIG. 8B illustrates the scanning trajectories of the exposing beams 53 in the case that the DMD 50 is inclined.

A great number (756, for example) of columns of rows of a great number (1024, for example) of micro mirrors aligned in the longitudinal direction, are provided in the lateral direction of the DMD 50. As illustrated in FIG. 8B, by inclining the DMD 50, the pitch $P_2$ of the scanning trajectories (scanning lines) of the exposure beams 53 become narrower than the pitch $P_1$ of the scanning lines in the case that the DMD 50 is not inclined. Therefore, the resolution of the image can be greatly improved. Meanwhile, because the angle of inclination of the DMD 50 is slight, the scanning width $W_2$ in the case that the DMD 50 is inclined and the scanning width $W_1$ in the case that the DMD is not inclined are substantially the same.

In addition, the same scanning lines are repeatedly exposed (multiple exposure) by different micro mirror columns. By performing multiple exposure in this manner, it becomes possible to finely control exposure positions with respect to alignment marks, and to realize highly detailed exposure. Seams among the plurality of exposure heads, which are aligned in the main scanning direction, can be rendered virtually seamless by finely controlling the exposure positions.

Note that the micro mirror columns may be shifted by predetermined intervals in the direction perpendicular to the sub-scanning direction to be in a staggered formation instead of inclining the DMD 50, to achieve the same effect.

Figure 9A:
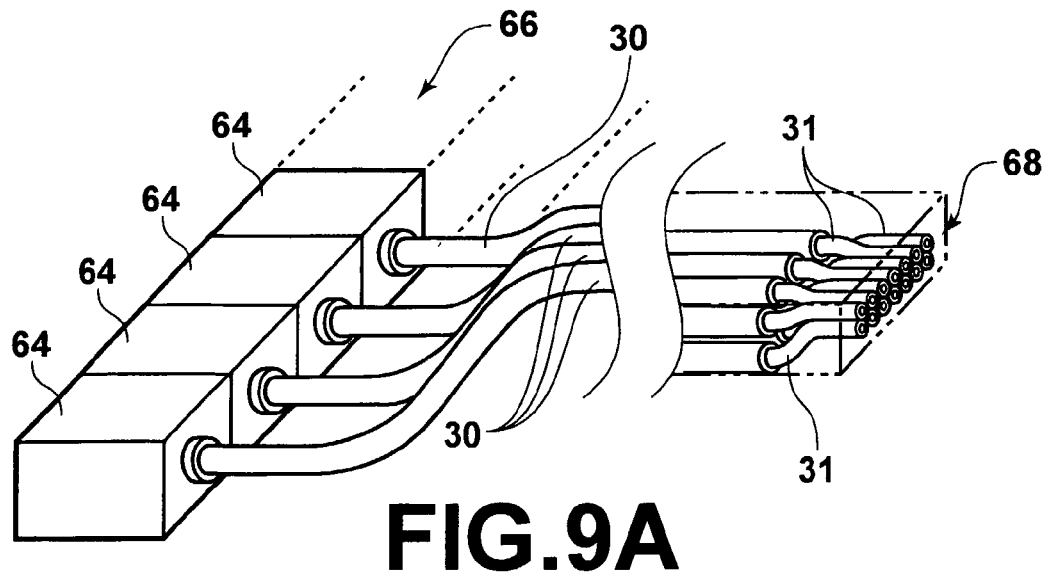
FIG. 9A is a perspective view that illustrates the construction of a fiber array light source.

As illustrated in FIG. 9A, the fiber array light source 66 is equipped with a plurality (14, for example) of laser modules 64. An end of a multi mode optical fiber 30 is coupled to each laser module 64. An optical fiber 31, having the same core diameter as the multi mode optical fiber 30 and a cladding diameter smaller than that of the multi mode optical fiber 30, is coupled to the other end of each multi mode optical fiber 30. As illustrated in detail in FIG. 9B, the optical fibers 31 are arranged such that seven ends of the optical fibers 30 opposite the end at which they are coupled to the multi mode optical fibers are aligned along the main scanning direction perpendicular to the sub scanning direction. Two rows of the seven optical fibers 31 constitute a laser emitting section 68.

Figure 9B:
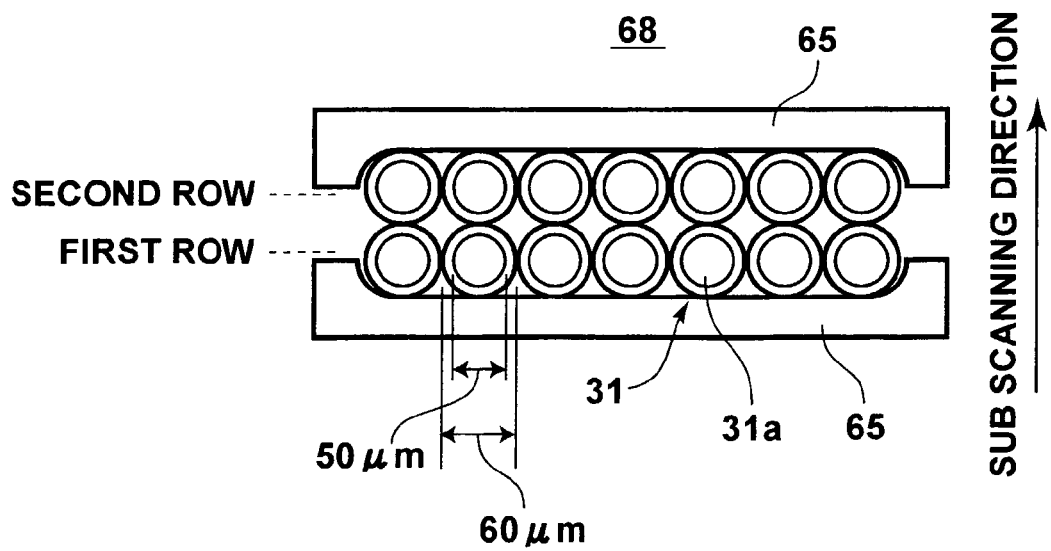
FIG. 9B is a front view that illustrates the arrangement of light emitting points of laser emitting portions of the fiber array light source.

As illustrated in FIG. 9B, the laser emitting section 68, constituted by the ends of the optical fibers 31, is fixed by being sandwiched between two support plates 65, which have flat surfaces. It is desirable for a transparent protective plate, such as that made of glass, to be placed at the light emitting end surfaces of the optical fibers 31. The light emitting end surfaces of the optical fibers 31 are likely to collect dust due to their high optical density and therefore likely to deteriorate. However, by placing the protective plate as described above, adhesion of dust to the end surfaces can be prevented, and deterioration can be slowed.

Figure 10:
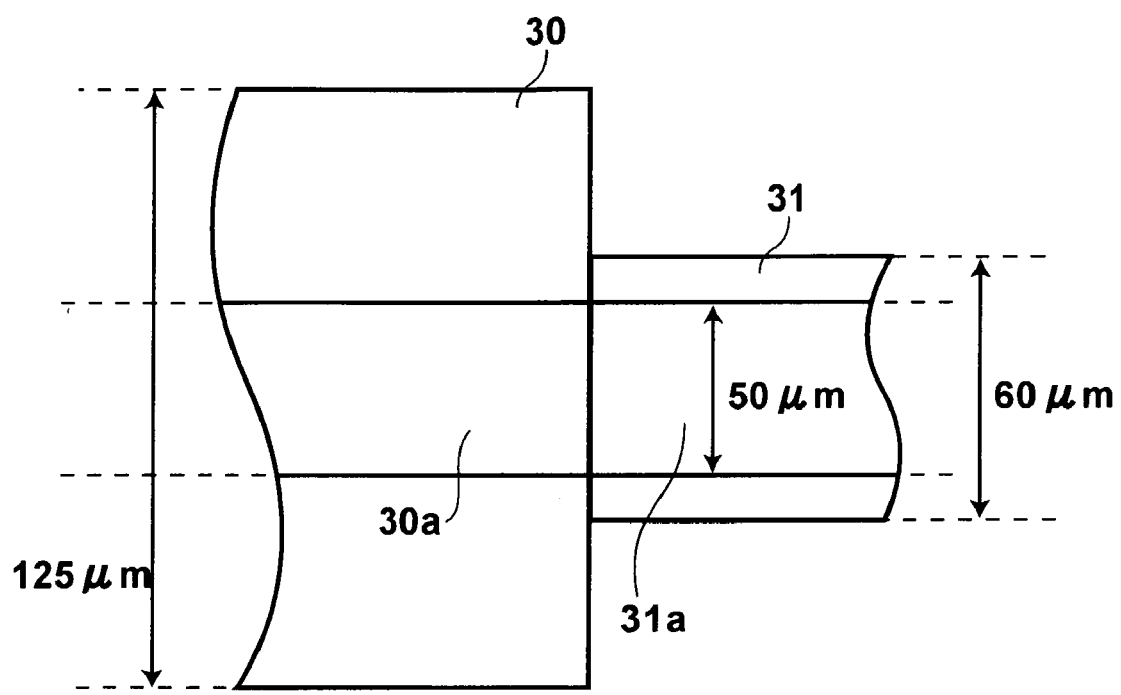
FIG. 10 is a diagram that illustrates the configuration of multi mode optical fibers.

In the present embodiment, the optical fiber 31 having a small cladding diameter and a length of approximately 1 to 30 cm is coaxially coupled to the light emitting end of the multi mode optical fiber 30 having a large cladding diameter, as illustrated in FIG. 10. Each pair of the optical fibers 30 and 31 are coupled by fusing the light incident end surface of the optical fiber 31 with the light emitting end surface of the multi mode optical fiber 30 such that the core axes thereof are matched. As described above, the diameter of the core 31a of the optical fiber 31 is the same as the diameter of the core 30a of the multi mode optical fiber 30.

Step index type optical fibers, graded index type optical fibers, or combined type optical fibers may be employed as the multi mode optical fibers 30 and the optical fibers 31. Step index type optical fibers produced by Mitsubishi Wire Industries KK may be employed, for example. In the present embodiment, the multi mode optical fibers 30 and the optical fibers 31 are step index type optical fibers. The multi mode optical fiber 30 has a cladding diameter of 125 μm, a core diameter of 50 μm, and an NA of 0.2. The optical fiber 31 has a cladding diameter of 60 μm, a core diameter of 50 μm, and an NA of 0.2. The transmissivity of the coating at the light incident end surface of the multi mode optical fiber 30 is 99.5% or greater.

The cladding diameter of the optical fiber 31 is not limited to being 60 μm. The cladding diameters of many optical fibers, which are utilized in conventional fiber light sources, are 125 μm. However, the focal depth becomes deeper as the cladding diameter decreases. Therefore, it is preferable for the cladding layer of a multi mode optical fiber to be 80 μm or less, and more preferably, 60 μm or less. Meanwhile, in the case of a single mode optical fiber, it is necessary for the core diameter to be at least 3 to 4 μm. Therefore, it is preferable for the cladding diameter of the optical fiber 31 to be 10 μm or greater. It is preferable for the core diameter of the multi mode optical fiber 30 and the core diameter of the optical fiber 31 to be matched, from the viewpoint of coupling efficiency.

Note that it is not necessary to employ two types of optical fibers 30 and 31 having different diameters by fusing them together (so-called "cross diameter fusion"). Alternatively, the fiber array light source may be constituted by bundling a plurality of optical fibers having the same cladding diameter (in the example of FIG. 9A, the optical fibers 30).

Figure 11:
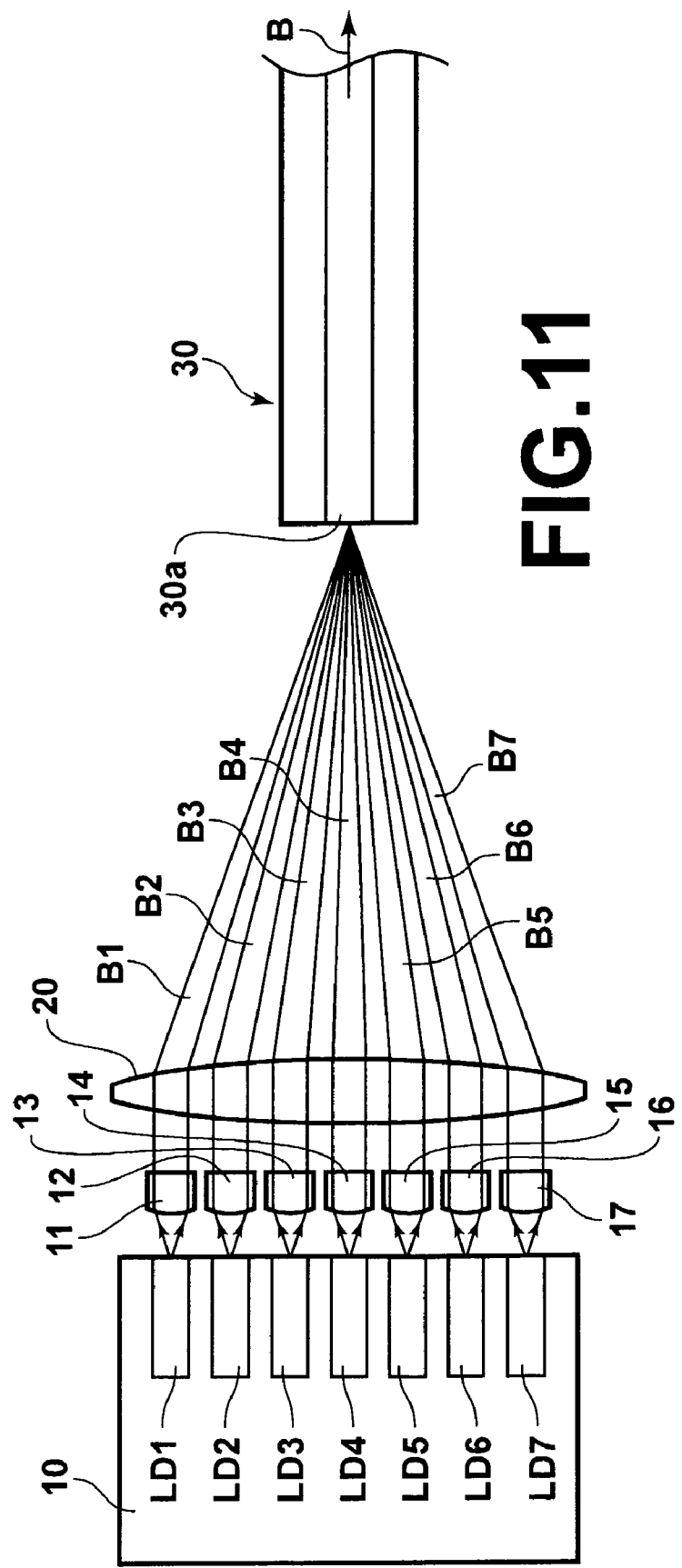
FIG. 11 is a plan view that illustrates the construction of a multiplex laser light source.

Each of the laser modules 64 is constituted by the multiplex laser light source (fiber light source) illustrated in FIG. 11. The multiplex laser light source comprises: a heat block 10; a plurality (seven, for example) GaN type semiconductor laser chips LD1, LD2, LD3, LD4, LD5, LD6, and LD7, which are aligned and fixed on the heat block 10; collimating lenses 11, 12, 13, 14, 15, 16, and 17, provided corresponding to each of the GaN type semiconductor lasers LD1 through LD7; a single condensing lens 20; and a single multi mode fiber 30. The GaN type semiconductor laser chips may be transverse multi mode laser chips or single mode laser chips. Note that the number of semiconductor lasers is not limited to 7, and any number of semiconductor lasers may be employed. In addition, a collimating lens array, in which the collimating lenses 11 through 17 are integrated, may be employed instead of the collimating lenses 11 through 17.

All of the GaN type semiconductor lasers LD1 through LD7 have the same oscillating wavelength (405 nm, for example), and the same maximum output (in the case of multi mode lasers, approximately 100 mW, and in the case of single mode lasers, approximately 50 mW). Note that the GaN type semiconductors may have any oscillating wavelengths other than 405 nm, within a wavelength range of 350 nm to 450 nm.

Figure 12:
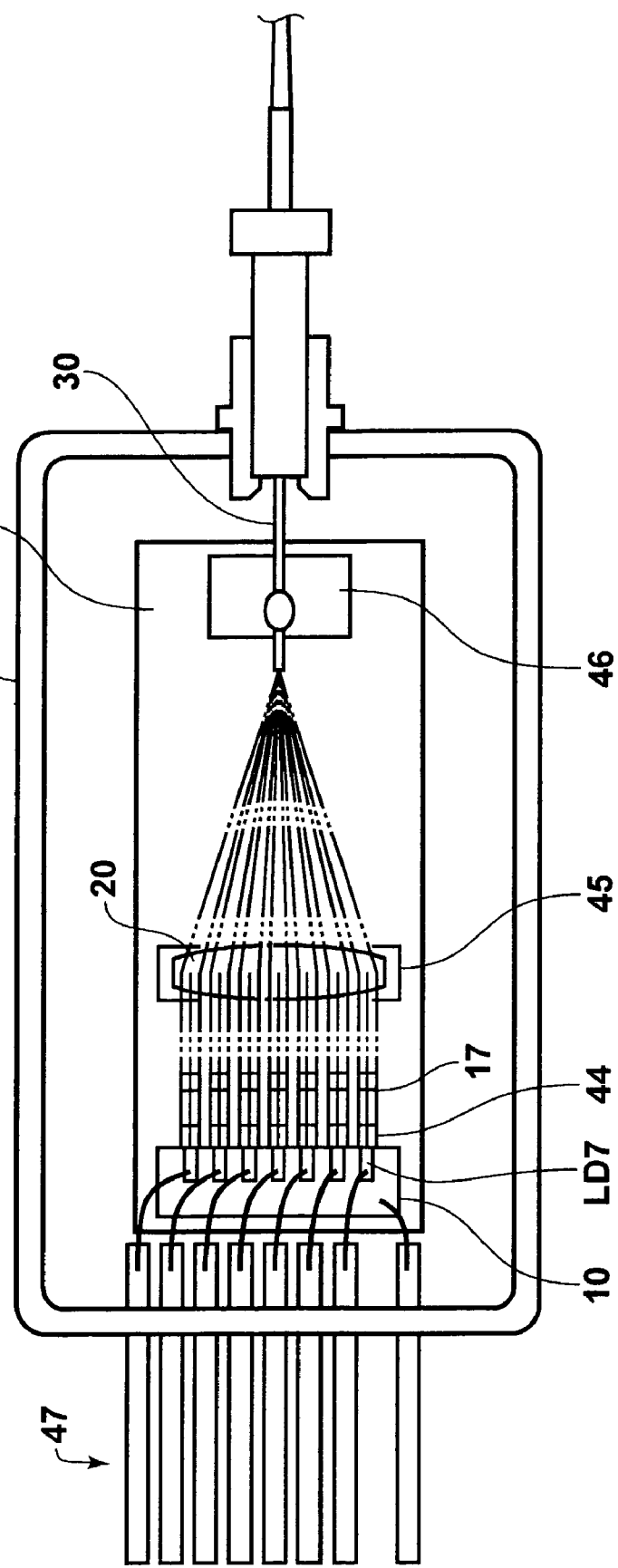
FIG. 12 is a plan view that illustrates the construction of a laser module.
Figure 13:
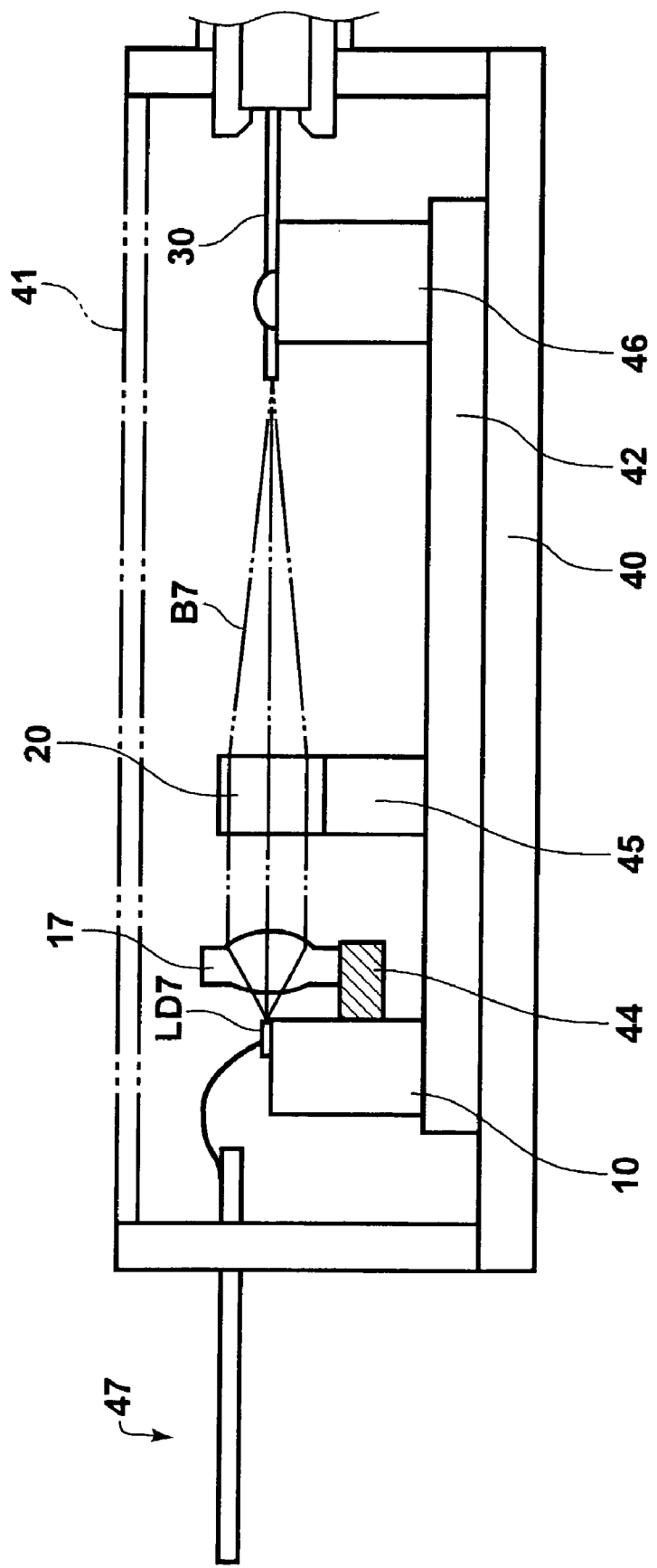
FIG. 13 is a side view of the laser module of FIG. 12.

As illustrated in FIGS. 12 and 13, the multiplex laser light source is housed within a box-shaped package 40 having an open top, along with other optical components. The package 40 is equipped with a package lid 41, formed to seal the open top. The package 40 is deaerated, sealing gas is introduced, and the package lid 41 is placed on the package. Thereby, the multiplex laser light source is hermetically sealed within the closed space (sealed space) of the package 40.

A base plate 42 is fixed on the bottom surface of the package 40. The heat block 10, a condensing lens holder 45 for holding the condensing lens 20, and a fiber holder 46 for holding the light incident end of the multi mode optical fiber 30 are mounted on the base plate 42. The light emitting end of the multi mode optical fiber 30 is pulled out to the exterior of the package 40 through an opening formed in a wall thereof.

A collimating lens holder 44 is mounted on a side surface of the heat block 10, and the collimating lenses 11 through 17 are held thereby. An opening is formed in a side wall of the package 40, and wires 47 for supplying drive current to the GaN type semiconductor lasers LD1 through LD7 are pulled out toward the exterior of the package 40 therethrough.

Note that in FIG. 13, only the GaN type semiconductor laser LD7 and the collimating lens 17 are labeled with reference numbers, in order to avoid complexity in the drawing.

Figure 14:
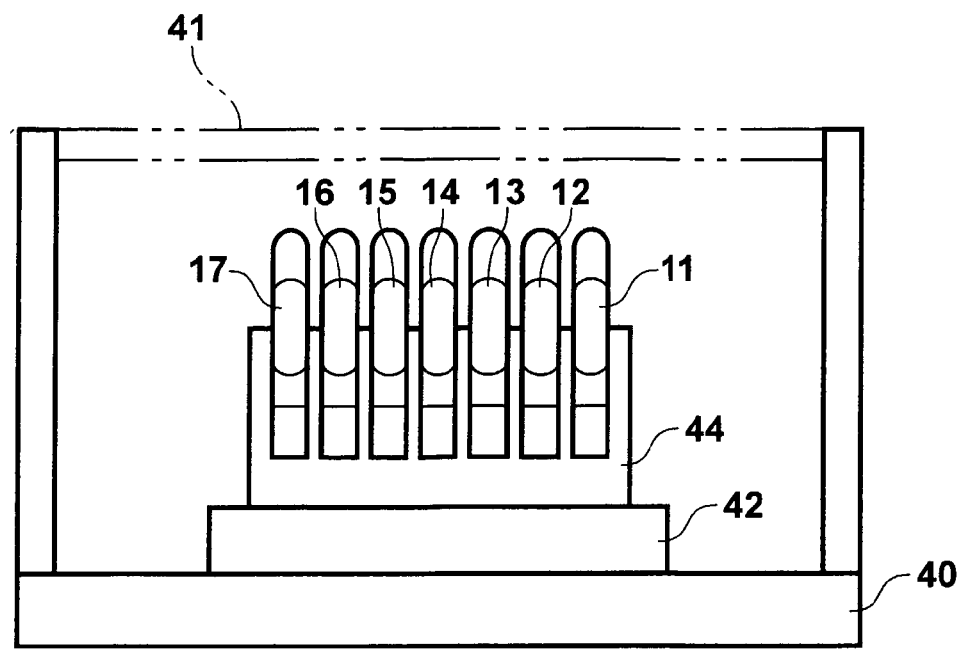
FIG. 14 is a partial front view of the laser module of FIG. 12.

FIG. 14 is a front view of the mounting portions of the collimating lenses 11 through 17. Each of the collimating lenses 11 through 17 is formed to be of an elongate shape, obtained by cutting out a region that includes the optical axis of a circular lens having an aspherical surface. The elongate collimating lenses may be formed by molding resin or optical glass, for example. The collimating lenses 11 through 17 are densely provided and such that their longitudinal directions are perpendicular to the arrangement direction of the light emitting points of the GaN type semiconductor lasers LD1 through LD7 (the horizontal direction in FIG. 14).

The GaN type semiconductor lasers LD1 through LD7 are arranged in fixed on the heat block 10 as described above. In addition, photodetectors PD1 through PD7 for detecting light emitted toward the rear of the GaN semiconductor lasers LD1 through LD7 are fixed on the heat block 10. The photodetectors PD1 through OD7 are constituted by photodiodes, for example.

The GaN type semiconductor lasers LD1 through LD7 comprise active layers having light emitting widths of 2 μm. Laser beams B1 through B7 having beam spread angles of 10 degrees and 30 degrees in the direction parallel to the active layer and the direction perpendicular to the active layer, respectively, are emitted from the GaN type semiconductor lasers LD1 through LD7. The GaN type semiconductor lasers LD1 through LD7 are provided such that the light emitting points thereof are aligned in a direction parallel to the active layers thereof.

Accordingly, the laser beams B1 through B7 are emitted from each of the light emitting points such that they enter the collimating lenses 11 through 17 in a state in which the directions that their beam spread angles are greater match the lengthwise directions of the collimating lenses 11 through 17, and in which the directions that their beam spread angles are smaller match the width directions of the collimating lenses 11 through 17. The widths and lengths of each of the collimating lenses 11 through 17 are 1.1 mm and 4.6 mm, respectively. The beam diameters of the laser beams B1 through B7 in the horizontal direction and the vertical direction are 0.9 mm and 2.6 mm, respectively. The collimating lenses 11 through 17 have focal distances $f_1$ of 3 mm, numerical apertures NA of 0.6, and are arranged at a pitch of 1.25 mm.

The condensing lens 20 is obtained by cutting out an elongate region that includes the optical axis of a circular lens having an aspherical surface at parallel planes. The condensing lens 20 is formed such that it is long in the arrangement direction of the collimating lenses 11 through 17, that is, the horizontal direction, and short in the direction perpendicular to the arrangement direction. The condensing lens 20 has a focal distance $f_2$ of 23 mm, and a numerical aperture NA of 0.2. The condensing lens 20 may also be formed by molding resin or optical glass, for example.

Figure 5:
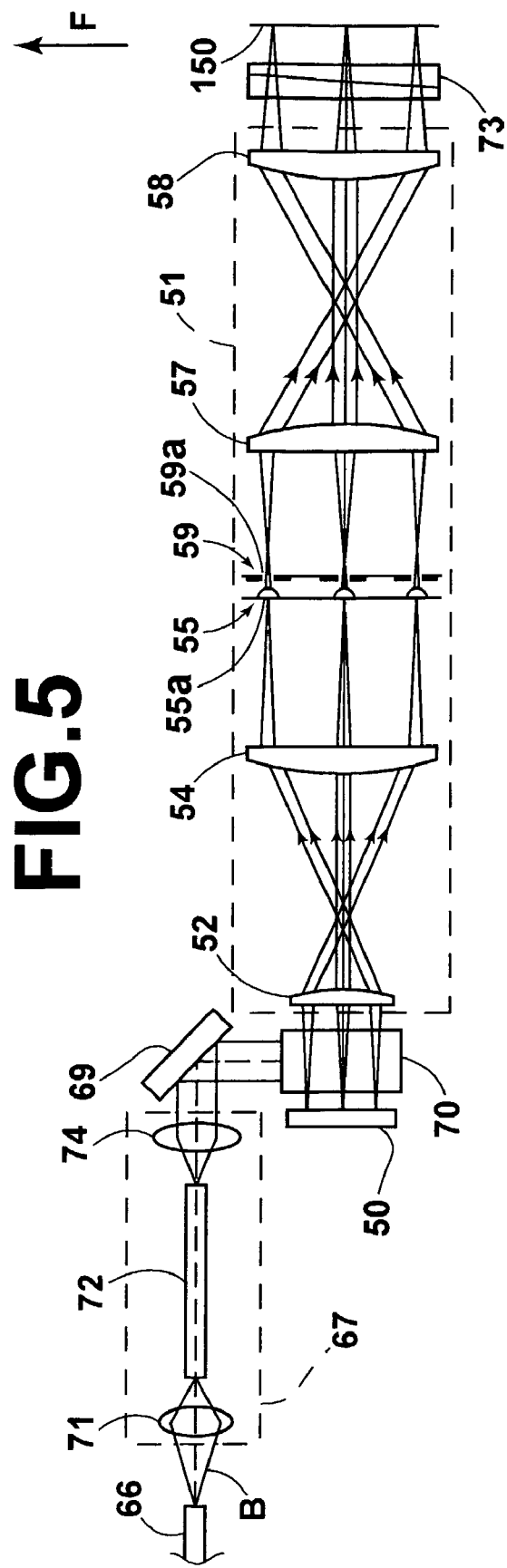
FIG. 5 is a schematic sectional view that illustrates the exposure head of the image exposure apparatus according to the first embodiment according to the present invention.

The micro lens array 55 illustrated in FIG. 5 is constituted by a great number of micro lenses 55a, which are arranged two dimensionally, corresponding to each pixel of the DMD 50. In the present embodiment, only 1024×256 columns out of 1024×768 columns of micro mirrors of the DMD 50 are driven, as will be described later. Therefore, 1024×256 columns of micro lenses 55a are provided, corresponding thereto. The arrangement pitch of the micro lenses 55a is 41 μm in both the vertical and horizontal directions. The micro lenses 55a are formed by optical glass BK7, and have focal distances of 0.19 mm and NA's (Numerical Apertures) of 0.11, for example.

The aperture array 59 has a great number of apertures 59a formed therethrough, corresponding to the micro lenses 55a of the micro lens array 55. In the present embodiment, the diameter of the apertures 59a is 10 μm.

The first focusing optical system constituted by the lens systems 52 and 54 illustrated in FIG. 5 magnifies the images that propagate thereto from the DMD 50 by 3× and focuses the images on the micro lens array 55. The second focusing optical system constituted by the lens systems 57 and 58 magnifies the images that have passed through the micro lens array 55 by 1.6×, and focuses the images onto the photosensitive material 150. Accordingly, the images from the DMD 50 are magnified at 4.8× magnification and projected onto the photosensitive material 150.

Note that in the present embodiment, a prism pair 73 is provided between the second focusing optical system and the photosensitive material 150. The focus of the image on the photosensitive material 150 is adjustable, by moving the prism pair 73 in the vertical direction in FIG. 5. Note that in FIG. 5, the photosensitive material 150 is conveyed in the direction of arrow F to perform sub-scanning.

Figure 17:
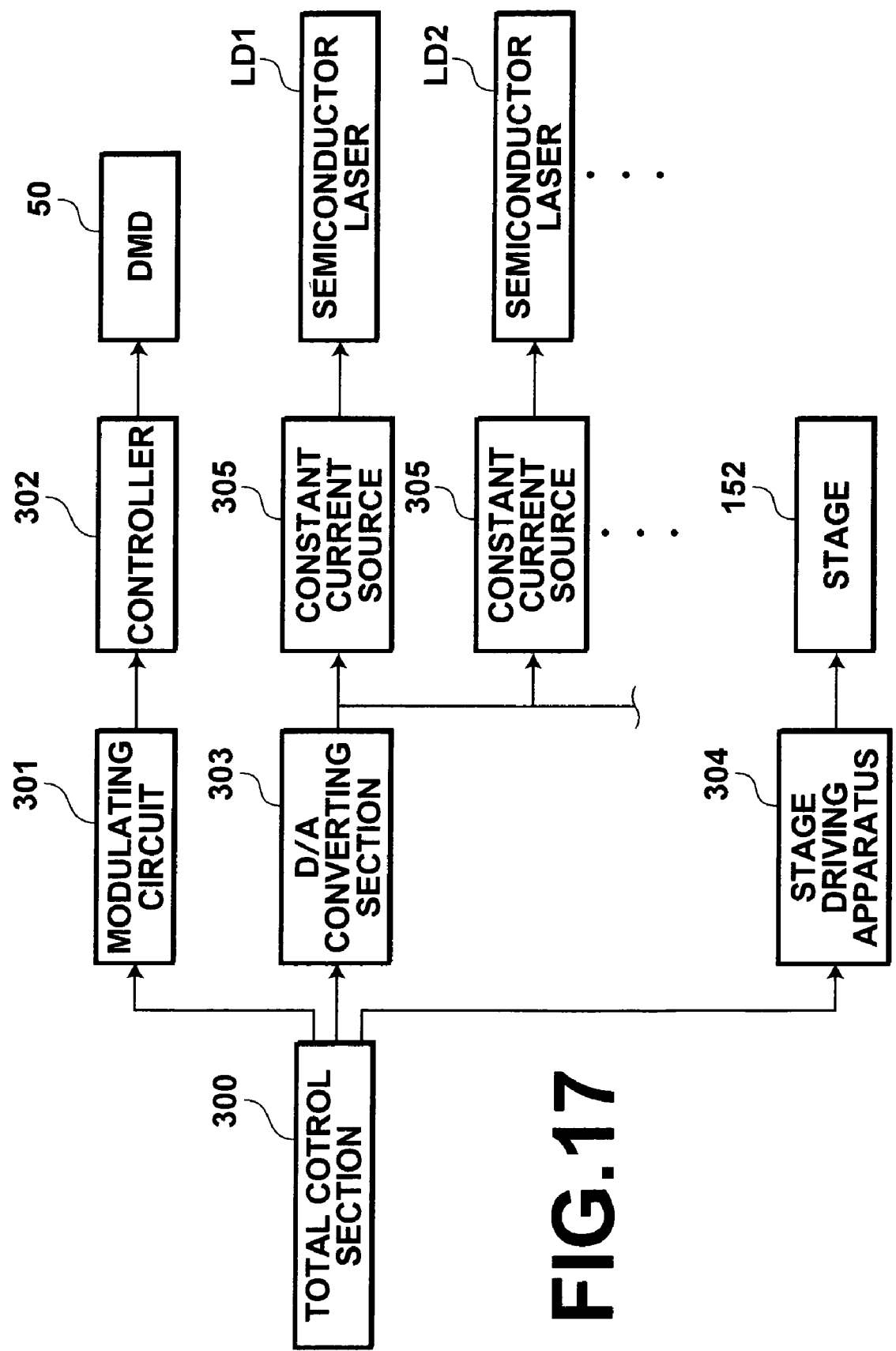
FIG. 17 is a block diagram that illustrates the electrical configuration of the image exposure apparatus according to the first embodiment according to the present invention.

Next, the electrical configuration of the image exposure apparatus of the present embodiment will be described with reference to FIG. 17. As illustrated in FIG. 17, a total control section 300 is connected to a modulating circuit 301, which in turn is connected to the controller 302 for controlling the DMD's 50. The total control section 300 is also connected to seven constant current sources 305, for driving each of the GaN type semiconductor lasers LD1 through LD7 of the laser modules 64, via a D/A converting section 303. Further, the total control section 300 is connected to the stage driving apparatus 304, for driving the stage 152.

[Operation of the Image Exposure Apparatus]

Next, the operation of the image exposure apparatus described above will be described. The laser beams B1 through B7 are emitted by each of the GaN type semiconductor lasers LD1 through LD7 (refer to FIG. 11) that constitute the multiplex laser light source of the fiber array light source 66 in a diffuse state, for each exposure head 166 of the scanner 162. The laser beams B1 through B7 are collimated by the collimating lens corresponding thereto, from among the collimating lenses 11 through 17. The collimated laser beams B1 through B7 are condensed by the condensing lens 20, and are converged onto the light incident surface of the core 30a of the multi mode optical fiber 30. Note that the GaN type semiconductor lasers LD1 through LD7 are driven by the APC driving method as will be described later, and are controlled such that their light outputs are constant.

In the present embodiment, the collimating lenses 11 through 17 and the condensing lens 20 constitute a condensing optical system, and the condensing optical system and the multi mode optical fiber 30 constitute a multiplex optical system. That is, the laser beams B1 through B7, which have been condensed by the condensing lens 20 enter the core 30a of the multi mode optical fiber 30, are multiplexed into a single laser beam B, and emitted from the optical fiber 31, which is coupled to the light emitting end of the multi mode optical fiber 30.

The coupling efficiency of the laser beams B1 through B7 with respect to the multi mode optical fiber 30 is 0.9 in each of the laser modules. In the case that the output of each of the GaN type semiconductor lasers LD1 through LD7 is 50 mW, a multiplexed laser beam B having an output of 315 mW (50 mW×0.9×7) can be obtained from each of the optical fibers 31 which are provided in the array. Accordingly, a laser beam B having an output of 4.4 W (0.315 W×14) can be obtained from the 14 combined optical fibers 31.

During image exposure, image data corresponding to an exposure correction pattern is input to the controller 302 of the DMD's 50 from the modulating circuit 301. The image data is temporarily stored in a frame memory of the controller 302. The image data represents the density of each pixel that constitutes an image as binary data (dot to be recorded/dot not to be recorded).

Figure 15:
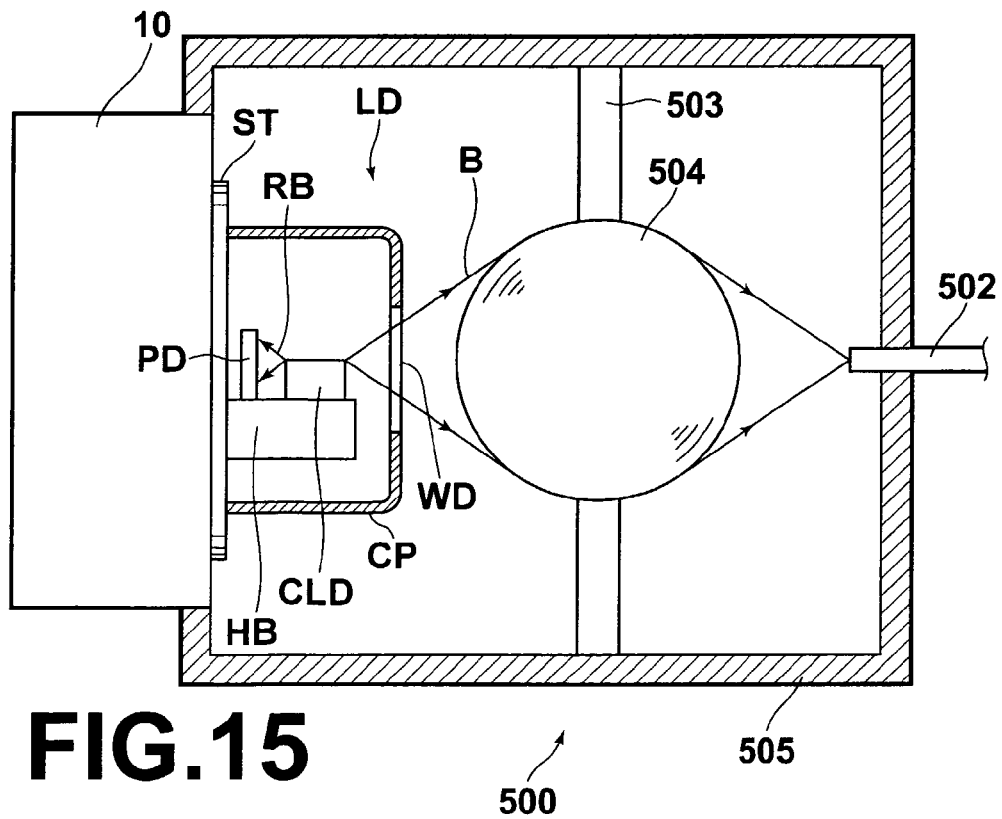
FIG. 15 is a partial sectional side view of another example of a semiconductor laser which is employed in the present invention.

The stage 152, on the surface of which the photosensitive material 150 is fixed by suction, is conveyed along the guides 158 from the upstream side to the downstream side of the gate 160 by the stage driving apparatus 304 illustrated in FIG. 15. When the stage 152 passes under the gate 160, the leading edge of the photosensitive material is detected by the sensors 164, which are mounted on the gate 160. Then, the image data recorded in the frame memory is sequentially read out a plurality of lines at a time. Control signals are generated by the signal processing section for each exposure head 166, based on the read out image data. Thereafter, the mirror driving control section controls the ON/OFF states of each micro mirror of the DMD's 50 of each exposure head, based on the generated control signals. Note that in the present embodiment, the size of each micro mirror that corresponds to a single pixel is 14 μm×14 μm.

When the laser beam B is irradiated onto the DMD's 50 from the fiber array light source 66, laser beams which are reflected by micro mirrors in the ON state are focused on the photosensitive material 150 by the lens systems 54 and 58. The laser beams emitted from the fiber array light source 66 are turned ON/OFF for each pixel, and the photosensitive material 150 is exposed in pixel units (exposure areas 168) substantially equal to the number of pixels of the DMD's 50 in this manner. The photosensitive material 150 is conveyed with the stage 152 at the constant speed. Sub-scanning is performed in the direction opposite the stage moving direction by the scanner 162, and band-shaped exposed regions 170 are formed on the photosensitive material 150 by each exposure head 166.

Figure 16A:
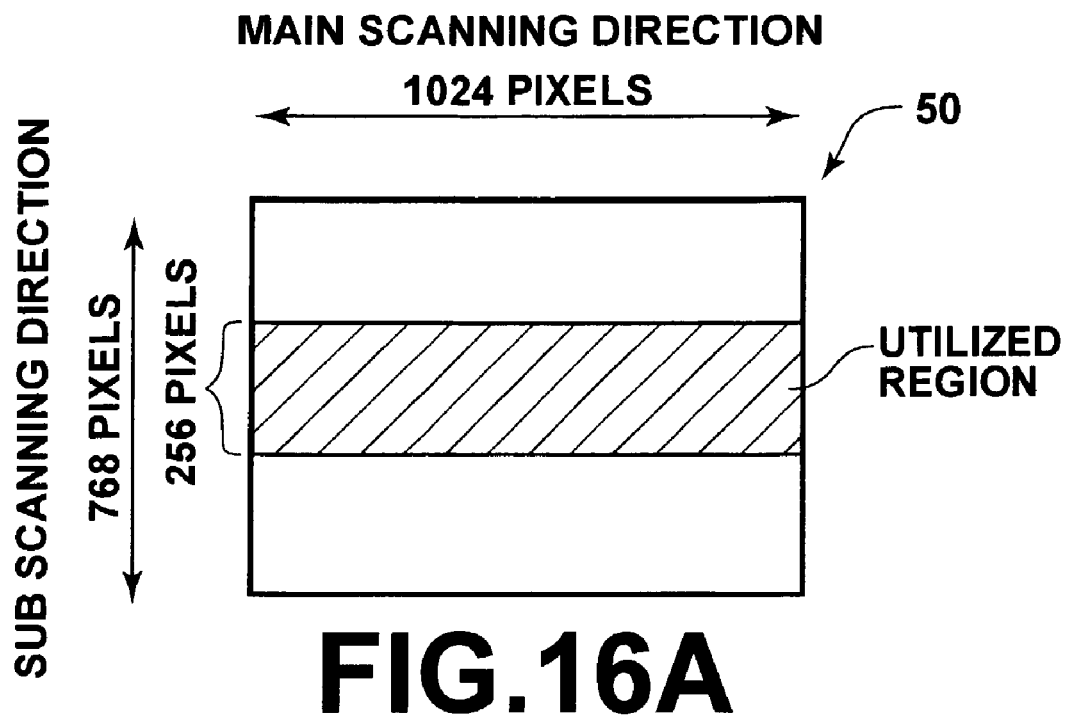
FIG. 16A is a diagram that illustrates an example of a utilized region of the DMD.
Figure 16B:
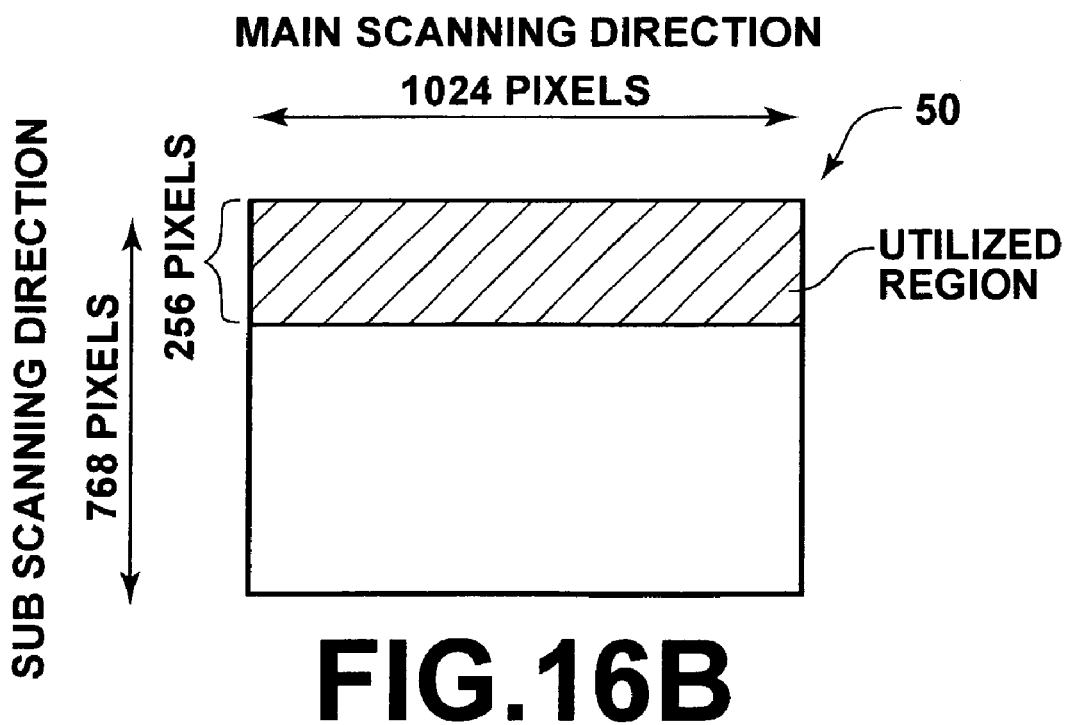
FIG. 16B is a diagram that illustrates an example of a utilized region of the DMD.

Note that in the present embodiment, 768 columns of micro mirror rows having 1024 micro mirrors therein are provided on each DMD 50 in the sub scanning direction, as illustrated in FIGS. 16A and 16B. However, only a portion of the micro mirror columns (256 columns of 1024 micro mirrors, for example) is driven by the controller 302.

In this case, the micro mirror columns situated at the central portion of the DMD 50 may be utilized, as illustrated in FIG. 16A. Alternatively, the micro mirror columns situated at the edge of the DMD 50 may be utilized, as illustrated in FIG. 16B. In addition, the micro mirror columns to be utilized may be changed as appropriate, in cases that defects occur in a portion of the micro mirrors and the like.

The data processing speed of the DMD's 50 is limited, and the modulation speed for each line is determined proportionate to the number of utilized pixels. Therefore, the modulation speed is increased by utilizing only a portion of the micro mirror columns. Meanwhile, in the case that an exposure method is adopted in which the exposure heads are continuously moved with respect to the exposure surface, it is not necessary to utilize all of the pixels in the sub scanning direction.

When sub scanning of the photosensitive material 150 by the scanner 162 is completed and the trailing edge of the photosensitive material 150 is detected by the sensors 162, the stage 152 is returned to its starting point at the most upstream side of the gate 160 along the guides 152 by the stage driving apparatus 304. Then, the stage 152 is moved from the upstream side to the downstream side of the gate 160 at the constant speed again.

[Details of the Optical Systems of the Image Exposure Apparatus]

Next, an illuminating optical system for irradiating the laser beam B onto the DMD's 50, comprising: the fiber array 66, the condensing lens 71, the rod integrator 72, the collimating lens 74, the mirror 69, and the TIR prism 70 illustrated in FIG. 5 will be described. The rod integrator 72 is a light transmissive rod, formed as a square column, for example. The laser beam B propagates through the interior of the rod integrator 72 while being totally reflected therein, and the intensity distribution within the cross section of the laser beam B is uniformized. Note that an anti-reflective film is coated on the light incident surface and the light emitting surface of the rod integrator 72, to increase the transmissivity thereof. By uniformizing the intensity distribution within the cross section of the laser beam B in this manner, unevenness in the intensity of the illuminating light can be eliminated, and highly detailed images can be exposed on the photosensitive material 150.

Next, the method for driving the GaN type semiconductor lasers LD1 through LD7 that constitute the laser module 64 will be described in detail with reference to FIG. 17. The total control section 300 illustrated in FIG. 15 is constituted by a PC (Personal Computer) or the like. The total control section 300 controls a laser driving section 305, which is provided for each semiconductor laser LD1 through LD7. Each laser driving section 305 drives each of the semiconductor lasers LD1 through LD7 by the APC driving method such that a constant target light output is obtained. That is, each laser driving section 305 controls the drive current of each of the semiconductor lasers LD1 through LD7 based on comparison results between the outputs of the photodetectors PD1 through PD7 that detect light emitted toward the rear of the semiconductor lasers LD1 through LD7 and a set value, to be described later.

Figure 18:
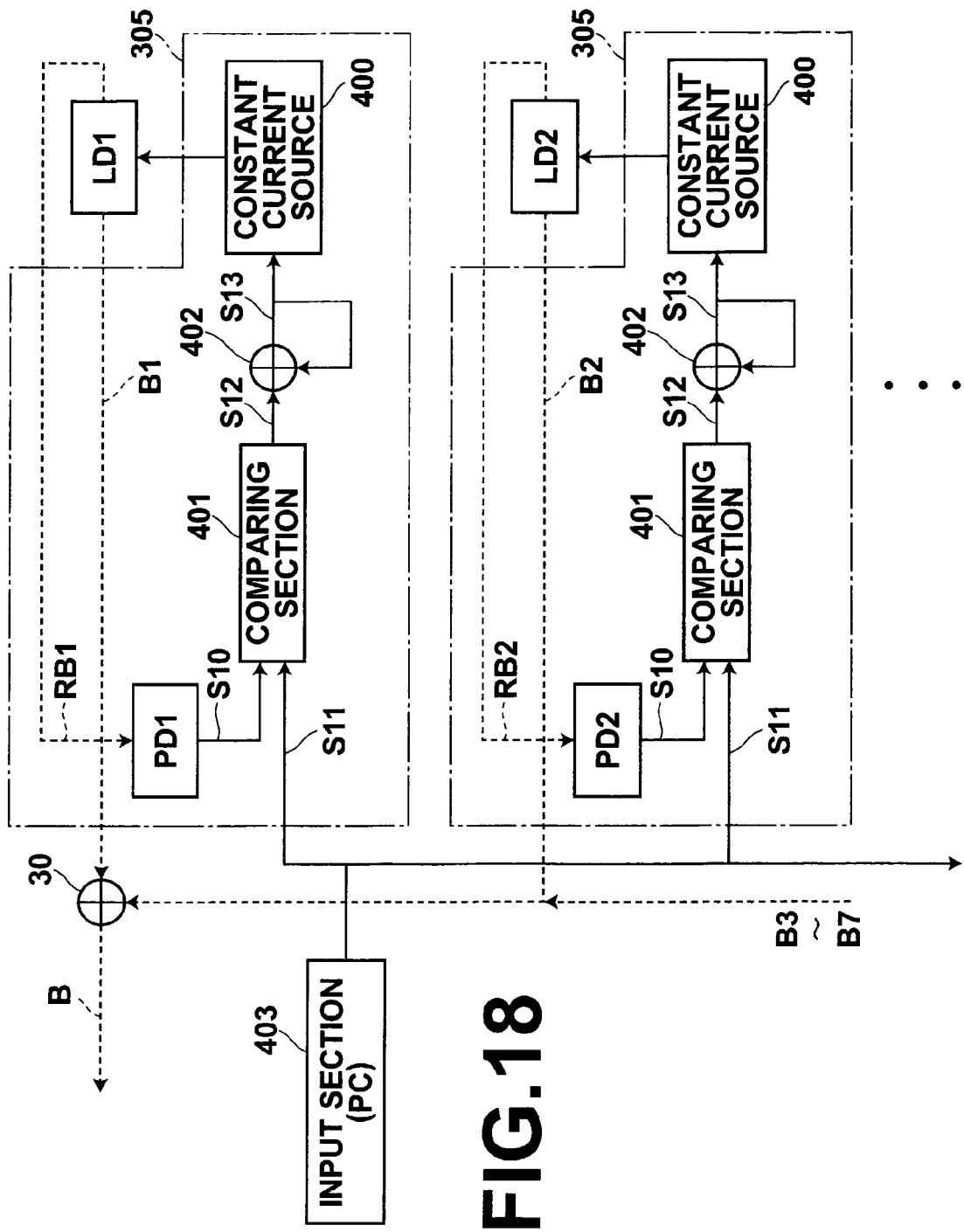
FIG. 18 is a block diagram that illustrates a semiconductor laser driving section of the image exposure apparatus.

Hereinafter, the APC driving method will be described in detail, by referring to FIG. 18, which illustrates the construction of the laser driving section 305. Here, the laser driving section 305 for driving the semiconductor laser LD1 will be described. However, the following description applies to the other semiconductor lasers LD2 through LD7. The laser driving section 305 comprises: a constant current source 400, for supplying drive current to the semiconductor laser LD1; the photodetector PD1, for detecting light emitted toward the rear of the semiconductor laser LD1; a comparing section 401 that outputs a difference signal S12; and an adding section 402 that receives the difference signal S12 output by the comparing section 401. Note that in FIG. 18, the photodetector and the rearward emitted light beam corresponding to the semiconductor laser LD2 are labeled as PD2 and RB2, respectively. In FIG. 18, reference numeral 30 denotes the multi mode optical fiber 30 that multiplexes the laser beams B1 through B7.

An output signal S10 of the photodetector PD1 and a set value S11 that represents a predetermined target light output are simultaneously input to the comparing section 401. The set value 11 is input from an input section 403. The set value S11 corresponds to a target light output in the APC driving method, and is output after being corrected according to a correction pattern which is recorded in an internal memory of the input section 403.

The comparing section 401 outputs the difference signal S12, which is S12=S11−S10. The difference signal S12 is input to the adding section 402. When the difference signal S12 is input, the adding section 402 changes a drive current setting signal S13 that specifies the value of the current supplied by the constant current source 400 to the semiconductor laser LD1, by adding the value of S12. By continually performing the addition process at predetermined intervals, the current supplied by the constant current source 400 to the semiconductor laser LD1 is continually changed to approximate a value such that S11=S10. That is, a value at which the light output of the laser beam B1, which is proportionate to the light output of the light RB1 emitted toward the rear of the semiconductor laser LD1, becomes substantially equal to the light output represented by the set value S11.

In the case that a uniform light output is attempted to be realized by the conventional APC driving method, the set value S11 is set to a constant value. However, in the present embodiment, the set value S11 is varied according to a correction pattern, which has been derived in advance, for a predetermined period of time following initiation of drive of the semiconductor laser LD1. The correction pattern is that which compensates for differences between the actual light output of the laser beam B1, detected by a photodetector provided at a position which is substantially not influenced by heat generated by the semiconductor laser LD1, and the amount of light received by the photodetector PD1, as described previously with reference to FIG. 19. By the set value S11 being varied along with the passage of time in this manner, the light output of the laser beam B1 converges to a desired value within a comparatively short amount of time from initiation of drive of the semiconductor laser LD1.

The configuration for driving the semiconductor lasers LD1 through LD7 in this manner utilizes the photodetectors PD1 through PD7, and can be produced by slightly modifying a configuration for realizing the APC driving method, which is generally provided in semiconductor laser apparatuses. Accordingly, a configuration that realizes the method can be produced simply and at low cost.

Figure 21:
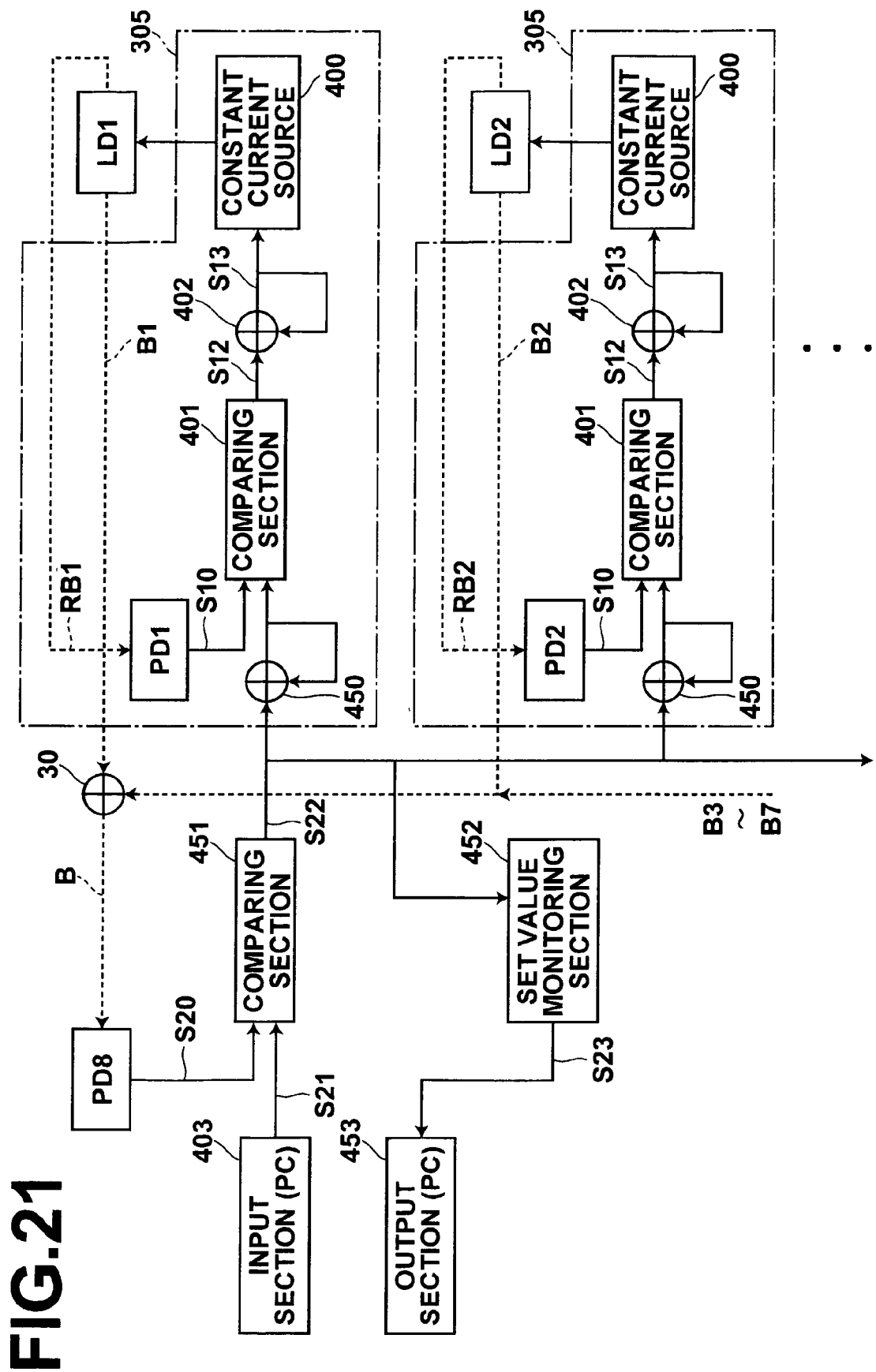
FIG. 21 is a schematic block diagram that illustrates an apparatus for deriving a correction pattern according to an embodiment of the present invention.

Next, the method by which the correction pattern is derived will be described. FIG. 21 illustrates an example of a correction pattern deriving apparatus that executes the method. Note that in FIG. 21, components which are equivalent to those illustrated in FIG. 18 are labeled with the same reference numerals, and detailed descriptions thereof will be omitted, unless particularly necessary.

The correction pattern deriving apparatus is configured to be used also as the laser driving section 305 of FIG. 18. The correction pattern deriving apparatus comprises: an adding section 450 provided at each laser driving section 305; an external photodetector PD8, constituted by a photodiode, for example, for detecting the multiplexed laser beam B; the input section 403; a comparing section 451, which is connected to the input section 403 and the external photodetector PD8, for inputting output signals to the adding section 450; a set value monitoring section 452, for receiving the output signals of the comparing section 451; and an output section 453, for receiving output signals from the set value monitoring section 452. Note that the external photodetector PD8 is provided at a position which is substantially not influenced by heat generated by the semiconductor lasers LD1 through LD7.

Hereinafter, the method for deriving a correction pattern employing the correction pattern deriving apparatus will be described. This method is executed prior to exposure operations by the aforementioned exposure apparatus, and the semiconductor lasers LD1 through LD7 are driven by the APC driving method in a manner similar to that during the exposure operation. At the initiation of drive, a set value S21 is directly input to the comparing section 401 from the input section 403, and APC driving is executed to obtain a light output corresponding to the set value S21. Here, the set value S21 corresponds to a predetermined light output which is required during image exposure.

The laser beams B1 through B7 emitted by the semiconductor lasers LD1 through LD7 are multiplexed by the multi mode optical fiber 30, and the multiplexed laser beam B is detected by the external photodetector PD8. The external photodetector PD8 outputs a signal S20 that represents the light output of the multiplexed laser beam B, and the signal S20 is input to the comparing section 451. The comparing section 451 compares the signal S20 output from the external photodetector PD8 against the set value S21, and outputs a difference signal S22 (S22=S21−S20). The difference signal S22 is input to the adding section 450. Thereby, APC operations such as those applied by the comparing section 401 and the adding section 402 are applied by the comparing section 451 and the adding section 450. However, the speed of this APC operation is performed at a speed of 10 Hz, for example, which is slower than the speed of the APC operation performed by the comparing section 401 and the adding section 402 (1 kHz, for example).

The light output of the multiplexed laser beam B is supposed to become constant by the APC driving method performed by the comparing section 401 and the adding section 402. However, the properties of the photodetectors PD1 through PD7 vary over time, as described previously. Therefore, the actual light output of the multiplexed laser beam B varies. On the other hand, the external photodetector PD8 is provided at a position which is not influenced by heat generated by the semiconductor lasers LD1 through LD7. Therefore, the external photodetector PD8 is capable of accurately detecting the light output of the multiplexed laser beam B, which fluctuates.

The difference signal S22 becomes the set value that represents the target light output in the APC drive performed by the comparing section 401 at a later stage. However, the difference signal S22, which is to function as the set value, is input to the set value monitoring section 452, and the value thereof is continually detected. The detected difference signal S22 is sampled at predetermined time intervals, and a signal S23 that represents the fluctuation pattern of the difference signal S22 over time from the initiation of drive is input to the output section 453. The output section 453 is constituted by a PC (Personal Computer), for example. The output section 453 outputs the combinations of the amounts of time passed from initiation of drive and the difference signals S22 corresponding thereto to a writing apparatus that writes data into a ROM (Read Only Memory, not shown) provided in each laser module 64 as a set value correction pattern. Thereby, the set value correction pattern is written into the ROM's.

The set value correction patterns are read out by the total control section 300 (refer to FIG. 17) when the laser modules 64 are mounted to the exposure apparatus, and recorded in the internal memory of the input section 403.

The set value correction pattern represented by the signal S23 is the fluctuation pattern of the set value (difference signal S22) when the actual light output of the laser beam B is uniformized by accurately detecting the actual light output with the external photodetector PD8. Therefore, when the apparatus illustrated in FIG. 18 drives the semiconductor lasers LD1 through LD7 by the APC driving method during image exposure, if the set value S11 input to the comparing section 401 from the input section 403 is varied according to the pattern, the actual light output of the laser beams B1 through B7 can be uniformized immediately following initiation of drive thereof.

FIG. 20 is a graph that illustrates an example of light output by one of the semiconductor lasers LD1 through LD7 when driven in this manner. Compared against the case of the conventional APC driving method illustrated in FIG. 19, the constant target light output is approached in a shorter amount of time, and a range of fluctuation $\Delta P_2$ of the light output is smaller than in the conventional method. Thereby, high output laser beams B1 through B7 (that is, the multiplexed laser beam B) can be stably obtained without a long start up time.

If the high output multiplexed laser beam B can be stably obtained without a long start up time, as described above, the standby time spent waiting for the output of the multiplexed laser beam B to stabilize can be shortened. That is, the takt time of the image exposure apparatus can be reduced. Therefore, the semiconductor lasers LD1 through LD7 can be replaced less frequently, thereby reducing the running costs of the exposure apparatus as well.

In the present embodiment, the process of varying the set value for the APC driving method is performed with a common timing for the plurality of semiconductor lasers LD1 through LD7. Therefore, only a single total control section 300 and D/A converting section 303 (refer to FIG. 17) are necessary as current control means, which enables manufacture of the driving apparatus at low cost.

Note that in the configuration illustrated in FIG. 21, the difference signal S22, which becomes the set value for the APC driving method input to the comparing section 401, is fed back from the external photodetector PD8. Alternatively, a fixed set value S21 output by a PC may be input to the comparing section 401. The correction pattern may be calculated later, by comparing the output S20 of the external photodetector PD8 against the output S10 of the photodetector PD1.

Note that in the present embodiment, the seven semiconductor lasers LD1 through LD7 that constitute a single laser module 64 are commonly driven based on a single correction pattern. Alternatively, four of the seven GaN type semiconductor lasers LD1 through LD7 may be driven based on a single correction pattern, while the remaining three may be driven based on another correction pattern. In this case as well, the same effects as those obtained when the plurality of semiconductor lasers are driven based on a single correction pattern can be obtained.

Fourteen laser modules 64 are employed in the present embodiment. Therefore, if the semiconductor lasers LD1 through LD7 of each module 64 are driven based on a single correction pattern, a total of fourteen correction patterns become necessary. Alternatively, several of the fourteen modules 64 may be driven based on a single common correction pattern. In this case, the necessary number of correction patterns can be less than fourteen.

In the present embodiment, the method for driving semiconductor lasers according to the present invention is applied to drive the semiconductor lasers LD1 through LD7 of the exposure apparatus comprising: the GaN type semiconductor lasers LD1 through LD7; and the optical fibers 30, into which the laser beams B1 through B7 emitted by each of the plurality of GaN type semiconductor lasers LD1 through LD7 enter to be multiplexed thereby. Therefore, it can be said that the stabilization effect of light output is particularly conspicuous.

That is, in the above structure, there are cases in which the output of the multiplexed laser beam B fluctuates, not only due to differences in the drive current/light output properties of the semiconductor lasers LD1 through LD7 that are driven, but also due to the heat generated thereby. The fluctuations are caused by thermal expansion of structural members of the modules 64 due to the generated heat. The thermal expansion shifts the laser beams B1 through B7 and the optical fibers 30 from their coaxial states, thereby changing the input efficiencies of the laser beams B1 through B7 with respect to the optical fibers 30. Further, there are cases in which the beam profiles of the laser beams B1 through B7 fluctuate during the period from drive initiation to a steady driving state. The input efficiencies of the laser beams with respect to the optical fibers 30 may change in these cases as well. For example, in the structure illustrated in FIGS. 11 through 13, approximately eight seconds are required from drive initiation of the lasers until the fluctuations in light output of the multiplexed laser beam B stabilizes to ±5% or less.

However, if the aforementioned correction pattern is generated by detecting the laser beam B emitted from the optical fiber 30, a correction pattern that reflect the changes in input efficiencies can be obtained. Therefore, fluctuations in light output caused by the changes in input efficiencies can also be corrected.

In the present embodiment, the method for driving semiconductor lasers according to the present invention is applied to drive the semiconductor lasers LD1 through LD7 which are commonly fixed on the single heat block 10 that functions as a heat sink. Based on this point as well, the method is particularly effective in stabilizing light output. That is, in this configuration, the properties of each of the semiconductor lasers LD1 through LD7 may change due to synergistic heat generated thereby. Even in this case, if the aforementioned correction pattern is generated by detecting the multiplexed laser beam B, a correction pattern that reflect the effects of the synergistic heat can be obtained. Therefore, fluctuations in light output of the laser beam B caused by synergistic heating of the GaN type semiconductor lasers LD1 through LD7 can also be corrected.

The aforementioned effects can be obtained both in the case that the temperatures of the plurality of semiconductor lasers are adjusted via the heat block 10 or the heat sink 501, and in the case that temperature adjustment is not performed.

In the present embodiment, the method for driving semiconductor lasers according to the present invention is applied to drive the plurality of GaN type semiconductor lasers LD1 through LD7. Therefore, the method is particularly effective in stabilizing light output of the semiconductor lasers. GaN type semiconductor lasers generate more heat in comparison with other types of semiconductor lasers, such as GaAs type semiconductor lasers. Therefore, the drive current/light output properties thereof fluctuate conspicuously during a period of time from drive initiation to a steady driving state. However, by applying the method for driving semiconductor lasers according to the present invention, the fluctuations in the drive current/light output properties of GaN type semiconductor lasers can be corrected, thereby enabling stabilization of output of the laser beams B1 through B7.

In addition, the GaN type semiconductor lasers LD1 through LD7 have the characteristic that only the oscillation threshold current thereof changes in response to temperature changes, at or near room temperature. That is, the slope efficiency thereof does not change greatly in response to temperature changes at or near room temperature. Therefore, a correction pattern, which is determined for an arbitrary current range, can be utilized within substantially all output ranges. That is, the correction pattern does not need to be changed according to changes in output. This point is not solely true for GaN type semiconductor lasers, but is also true for other semiconductor lasers, for which a temperature characteristic coefficient $T_1$ of the slope efficiency is small with respect to a temperature characteristic coefficient $T_0$ of the oscillation threshold current.

Note that the coefficient $T_0$ is a coefficient that represents temperature characteristics of an oscillation threshold current $I_{th}$ in an IL waveform (drive current/light output property) of a semiconductor laser. The coefficient $T_1$ is a coefficient that represents the temperature property of a slope efficiency $\eta_d$ of a semiconductor laser. If the IL waveform has an oscillation threshold current $I_{tha}$ and a slope efficiency $\eta_{da}$ at a temperature $T_a$ and an oscillation threshold current $I_{thb}$ and a slope efficiency $\eta_{db}$ at a temperature $T_b$, $T_0$ and $T_1$ can be defined by the following formulas:

$$T_0 = \frac{T_a - T_b}{In(I\eta_{tha} / I\eta_{thb})}$$

$$T_1 = \frac{T_a - T_b}{In(I\eta_{da} / I\eta_{db})}$$

Note that the set value correction pattern, is constituted by combinations of the amounts of time passed from initiation of drive and the difference signals S22 corresponding thereto. The greater the number of combinations (the more frequently the difference signal S22 is sampled), the stabilizing effect on light output is improved. However, if the number of combinations is excessive, a high capacity memory becomes necessary, a longer amount of time for processing parameters, and a more complex system becomes necessary.

The set value correction pattern may be generated by methods other than that described above. Hereinafter, an example of such a method will be described with reference to the configuration illustrated in FIG. 18. In the present method, the semiconductor lasers LD1 through LD7 are driven by the APC driving method. At this time, the light output of the multiplexed laser beam B emitted from the optical fiber 30 is detected by an external photodetector provided at a position which is substantially not influenced by heat generated by the semiconductor lasers LD1 through LD7. Set values S11 that would uniformize the light output are calculated for each increment of time that passes, from the fluctuation properties of the output of the external photodetector as time passes. The fluctuation pattern of the set value S11 accompanying the passage of time obtained in this manner may also be utilized as the set value correction pattern.

Figure 23:
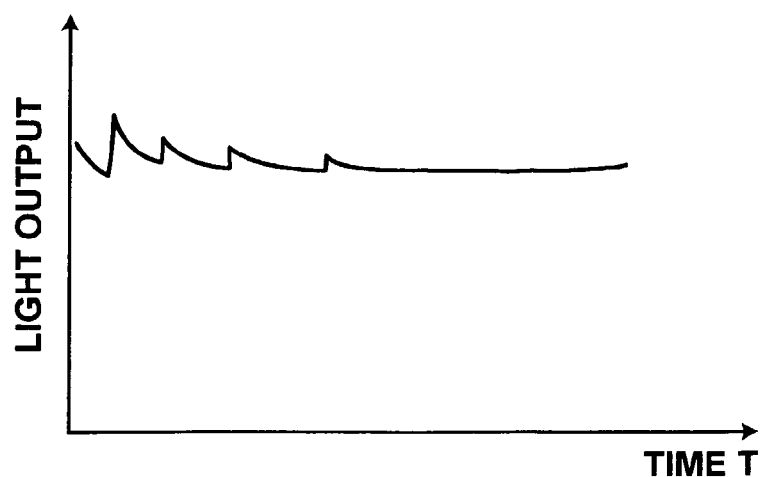
FIG. 23 is a graph that illustrates an example of light output fluctuation properties of a semiconductor laser driven by the method according to the present invention.
Figure 24:
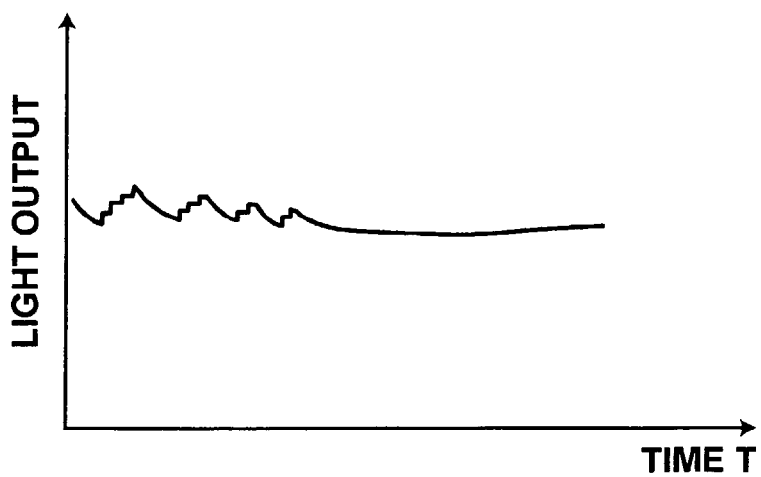
FIG. 24 is a graph that illustrates another example of light output fluctuation properties of a semiconductor laser driven by the method according to the present invention.

In the case that laser beams which have been emitted from a plurality of semiconductor lasers are multiplexed as in the above embodiment, it is desirable for the process of varying the set values for the APC driving method to be performed with time lags therebetween. In this case, slight variations in light output among each of the semiconductor lasers prior to multiplexing are canceled, and variations in light output of a multiplexed laser beam can be smoothed. That is, in the case that the light output of a multiplexed laser beam is as that illustrated in FIG. 23 without the time lags, the light output of the multiplexed laser beam can be smoothed to that illustrated in FIG. 24, by providing the time lags.

The embodiment described above is for a case in which a plurality of semiconductor lasers are driven. Alternatively, the method for driving semiconductor lasers according to the present invention can be applied to cases in which a single semiconductor laser is driven. In addition, it goes without saying that the method for driving semiconductor lasers according to the present invention may be applied to cases in which a plurality of semiconductor lasers are driven without multiplexing by optical fibers.

Further, when executing the method for driving semiconductor lasers according to the present invention, the drive currents for semiconductor lasers in the OFF state may be a current slightly less than the oscillation threshold currents thereof, and not 0 mA. For example, for semiconductor lasers having an oscillation threshold current of 35 mA, a current of 30 mA may be supplied thereto in their OFF state. Thereby, the temperature difference of the semiconductor lasers between their OFF and ON states can be reduced, and output fluctuations when the APC drive method is implemented can be decreased.

Figure 22:
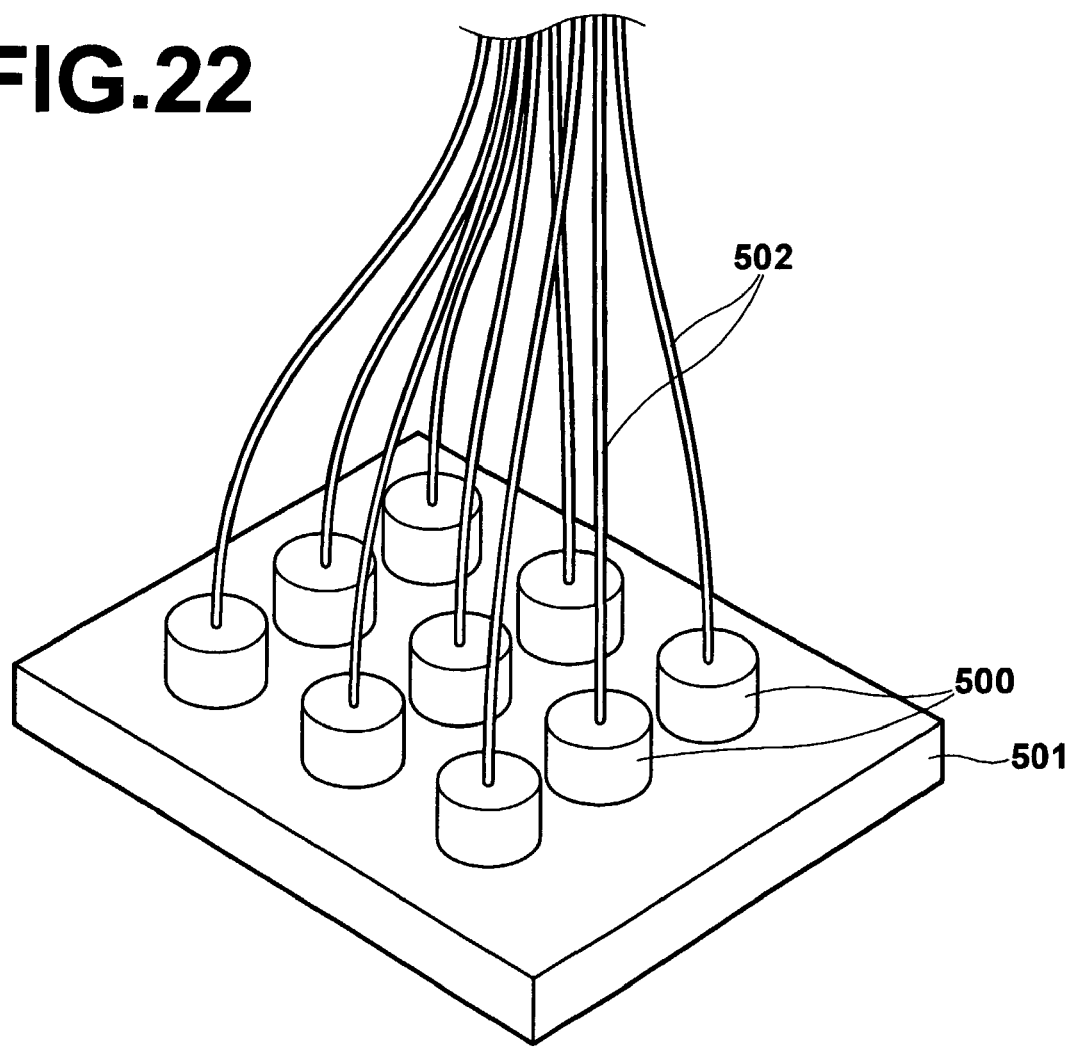
FIG. 22 is a perspective view that illustrates another laser apparatus to which the driving method according to the present invention is applied.

The aforementioned effects are not limited to being obtained in a multiplexing laser module such as that illustrated in FIGS. 11 through 13. The same effects can be obtained in a structure in which a plurality of semiconductor lasers 500, constituted by semiconductor laser chips housed in a Can type package, are fixed onto a common heat sink 501, as illustrated in FIG. 22. Note that in this structure, each laser beam emitted by each of the semiconductor laser 500 is led to positions at which they are used by an optical fiber 502.

Hereinafter, the configuration of the semiconductor laser device 500 will be described with reference to FIG. 15. Note that in FIG. 15, components which are equivalent to those illustrated in FIGS. 11 through 13 are denoted with the same reference numerals, and detailed descriptions thereof will be omitted, unless particularly necessary (the same will apply to all following descriptions).

As illustrated in FIG. 15, the semiconductor laser device 500 comprises: a Can package type semiconductor laser LD; a ball lens 504, for condensing the laser beam B emitted by the semiconductor laser LD; and a support member 503, for supporting the ball lens 504 from below, all provided within a package 505. The package 505 also houses an end of the optical fiber 502. The Can package type semiconductor laser LD comprises a laser diode chip CLD, which is housed within a Can type package CP. That is, the laser diode chip CLD is fixed on a heat block HB, which is fixed on a stem ST and provided within the package CP. The laser beam B emitted forward (toward the right in FIG. 15) is emitted through a glass window WD of the package CP. A photodetector PD, constituted by a photodiode or the like, for detecting light RB emitted toward the rear of the laser diode chip CLD, is also fixed on the heat block HB.

In this structure, the laser beam B emitted from the Can package type semiconductor laser LD is condensed by the ball lens 504. The condensed laser beam B enters the optical fiber 502, which is provided so that a light incident end surface thereof is positioned at the point where the condensed laser beam B converges. The laser beam B propagates through the optical fiber 502 to a location, at which it is to be utilized.

Figure 25:
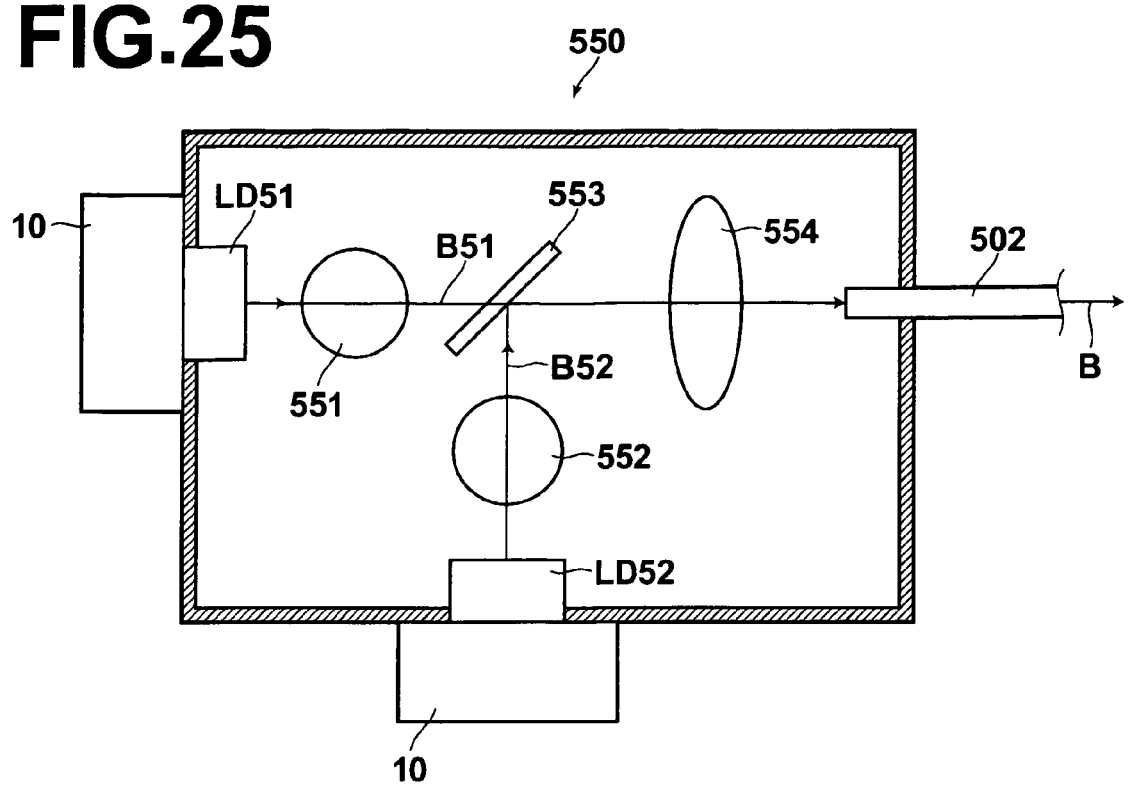
FIG. 25 is a partial sectional side view that illustrates yet another semiconductor laser device to which the driving method according to the present invention is applied.

Further, the present invention may be applied to a semiconductor laser device 550 illustrated in FIG. 25. The semiconductor laser device 550 multiplexes laser beams emitted from two semiconductor lasers, and causes the multiplexed laser beam to enter a single optical fiber. That is, the semiconductor laser device 550 comprises: two semiconductor lasers LD51 and LD52, which are similar to the Can package type semiconductor laser LD illustrated in FIG. 15; collimating lenses 551 and 552 for collimating laser beams B51 and B52, which are emitted from the semiconductor lasers LD51 and LD52 in a diffuse state; a beam splitter 553, for multiplexing the collimated laser beams B51 and B52 into a single laser beam B; and a condensing lens 554, for condensing the multiplexed laser beam B and causing it to enter the optical fiber 502.

In the case that the semiconductor lasers LDS1 and LD52 are driven by the method for driving semiconductor lasers of the present invention, basically the same effects as those described above can be obtained.

Figure 26:
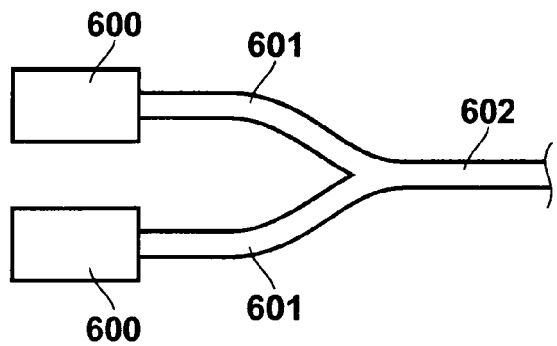
FIG. 26 is a partial sectional side view that illustrates still yet another semiconductor laser device to which the driving method according to the present invention is applied.

Further, the present invention may be applied to a semiconductor laser device such as that illustrated in FIG. 26. The semiconductor laser device of FIG. 26 comprises: two semiconductor lasers 600 and 600; optical fibers 601 and 601, into which laser beams emitted by the semiconductor lasers 600 and 600 are caused to enter; and a single optical fiber 602, to which the optical fibers 601 and 601 are coupled.

Figure 27:
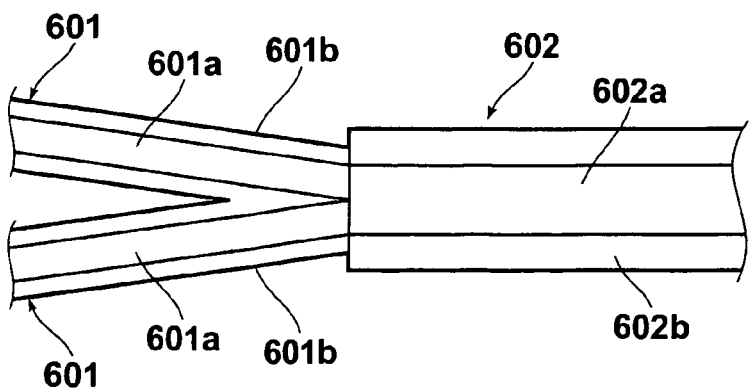
FIG. 27 is a magnified partial schematic side view that illustrates a portion of the device of FIG. 26.

The fiber coupling portion of the semiconductor laser device of FIG. 26 is illustrated in detail in FIG. 27. Each of the optical fibers 601 is constituted by a core 601a and cladding 601b provided at the exterior of the core 601a. The optical fiber 602 is also constituted by a core 602a and a cladding 602b provided at the exterior of the core 602a. The optical fibers 601 and the optical fiber 602 are fusion bonded such that each of the cores 601a of the optical fibers 601 is coupled with the core 602a of the optical fiber 602, thereby enabling multiplexing of two laser beams into a single laser beam.

In the case that the semiconductor lasers 600 and 600 are driven by the method for driving semiconductor lasers of the present invention, basically the same effects as those described above can be obtained.

Note that the present invention is not limited to being applied to semiconductor laser devices in which two optical fibers are fusion bonded to a single optical fiber. The present invention is equally applicable to semiconductor laser devices constituted by three or more optical fibers, which are fusion bonded to a single optical fiber.

The invention is:

1. A method for driving at least one semiconductor laser, comprising:

detecting the output of the at least one semiconductor laser with at least one photodetector;

comparing the output of the at least one photodetector against a set value corresponding to a target light output of the at least one semiconductor laser; and controlling the drive current of the at least one semiconductor laser based on the comparison results, wherein:

a correction pattern, which is defined according to the amount of time which has passed since initiating driving thereof, that enables obtainment of a substantially uniform light output is generated in advance; and the set value and/or the output of the at least one photodetector is varied according to a single correction pattern for a predetermined period of time from initiation of drive of the at least one semiconductor laser, wherein:

in the case that laser beams emitted from the plurality of semiconductor lasers are combined, varying the set value and/or the output of the at least one photodetector according to the correction pattern is performed with time lags among the plurality of semiconductor lasers.

2. An apparatus for driving at least one semiconductor laser by:

detecting the output of the at least one semiconductor laser with at least one photodetector;

comparing the output of the at least one photodetector against a set value corresponding to a target light output of the at least one semiconductor laser; and controlling the drive current of the at least one semiconductor laser based on the comparison results, comprising:

memory means, in which a correction pattern, which is defined according to the amount of time which has passed since initiating driving thereof, that enables obtainment of a substantially uniform light output is recorded; and control means, for varying the set value and/or the output of the at least one photodetector according to a single correction pattern for a predetermined period of time from initiation of drive of the semiconductor laser, wherein:

laser beams emitted from the plurality of semiconductor lasers are combined; and the control means varies the set value and/or the output of the at least one photodetector according to the correction pattern, with time lags among the plurality of semiconductor lasers.

* * * * *